US012794417B2

United States Patent

(12) United States Patent
Fukasawa et al.

(10) Patent No.: US 12,794,417 B2
(45) Date of Patent: Nov. 10, 2026

(54) TRACKER MODULE AND COMMUNICATION DEVICE

(71) Applicant: Murata Manufacturing Co., Ltd., Nagaokakyo (JP)

(72) Inventors: Mikiko Fukasawa, Nagaokakyo (JP); Takayuki Tomita, Nagaokakyo (JP); Takeshi Kogure, Nagaokakyo (JP); Kenzou Oomori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 394 days.

(21) Appl. No.: 18/618,120

(22) Filed: Mar. 27, 2024

(65) Prior Publication Data

US 2024/0235487 A1 Jul. 11, 2024

Related U.S. Application Data

(63) Continuation of application No. PCT/JP2022/035996, filed on Sep. 27, 2022.

(30) Foreign Application Priority Data

Sep. 29, 2021 (JP) ................................ 2021-159686

(51) Int. Cl.
*H03F 1/02* (2006.01)
*H03F 3/24* (2006.01)

(52) U.S. Cl.
CPC ........... *H03F 1/025* (2013.01); *H03F 1/0227* (2013.01); *H03F 3/245* (2013.01); *H03F 2200/105* (2013.01); *H03F 2200/451* (2013.01)

(58) Field of Classification Search
CPC ........ H03F 1/0227; H03F 1/025; H03F 3/245; H03F 2200/105; H03F 2200/451
See application file for complete search history.

(56) References Cited

U.S. PATENT DOCUMENTS 8,503,203 B1 * 8/2013 Szczeszynski ........ H02M 3/073 327/356
8,824,978 B2 9/2014 Briffa et al.
9,755,672 B2 9/2017 Perreault et al.
(Continued)

FOREIGN PATENT DOCUMENTS

JP 2001-007456 A 1/2001
JP 2015-533066 A 11/2015

OTHER PUBLICATIONS

International Search Report received for PCT Patent Application No. PCT/JP2022/035996, mailed on Dec. 27, 2022, 2 pages.

*Primary Examiner* — Jue Zhang
(74) *Attorney, Agent, or Firm* — ArentFox Schiff LLP

(57) ABSTRACT

A tracker module is provided that includes a module laminate and one or more integrated circuits that are disposed on the module laminate and that includes an integrated circuit. The integrated circuit includes a switch included in a pre-regulator circuit, at least one switch included in a switched-capacitor circuit, a first IC terminal connected to the switch included in the pre-regulator circuit, and a second IC terminal connected to one of the at least one switch included in the switched-capacitor circuit. The at least one integrated circuit includes a switch included in a supply modulator. The module laminate includes a signal line with which the first IC terminal is connected to the second IC terminal.

20 Claims, 13 Drawing Sheets

(56) References Cited

U.S. PATENT DOCUMENTS

| | | | | |
|---|---|---|---|---|
| 2010/0117727 | A1* | 5/2010 | Dawson | H03F 3/602<br>330/124 R |
| 2013/0187612 | A1* | 7/2013 | Aiura | H01M 10/425<br>320/118 |
| 2013/0229841 | A1* | 9/2013 | Giuliano | H02M 3/158<br>363/60 |
| 2014/0118063 | A1* | 5/2014 | Briffa | H03F 1/0288<br>330/127 |
| 2015/0155895 | A1 | 6/2015 | Perreault et al. | |
| 2019/0297757 | A1 | 9/2019 | Henzler et al. | |

* cited by examiner

TRACKER MODULE AND COMMUNICATION DEVICE

CROSS REFERENCE TO RELATED APPLICATIONS

This application is a continuation of International Application No. PCT/JP2022/035996, filed Sep. 27, 2022, which claims priority to Japanese Patent Application No. 2021-159686, filed Sep. 29, 2021, the entire contents of each of which are hereby incorporated by reference in their entirety.

TECHNICAL FIELD

The present invention relates to a tracker module and a communication device.

BACKGROUND

U.S. Pat. No. 9,755,672 (HEREINAFTER "Patent Document 1") discloses a supply modulator capable of supplying power supply voltage that is dynamically adjusted with time in accordance with a radio-frequency signal to a power amplifier.

In operation, when at least part of the supply modulator in Patent Document 1 is to be modularized using an integrated circuit (IC), lines in the IC may be complicated to degrade characteristics.

SUMMARY OF THE INVENTION

In view of the foregoing, a tracker module and a communication device are provided that are configured to suppress the degradation of the characteristics.

According to an exemplary aspect, a tracker module is provided that includes a module laminate and at least one integrated circuit that is disposed on the module laminate and that includes a first integrated circuit. The first integrated circuit includes a switch included in a pre-regulator circuit that is configured to convert input voltage into first voltage, at least one switch included in a switched-capacitor circuit that is configured to generate a plurality of discrete voltages based on the first voltage, a first IC terminal connected to the switch included in the pre-regulator circuit, and a second IC terminal connected to one of the at least one switch included in the switched-capacitor circuit. The at least one integrated circuit includes a switch included in a supply modulator that is configured to selectively output at least one of the discrete voltages generated by the switched-capacitor circuit. The module laminate includes a first signal line that connects the first IC terminal to the second IC terminal.

According to another exemplary aspect, a tracker module is provided that includes a module laminate and a first integrated circuit disposed on the module laminate. The first integrated circuit includes at least one switch included in a switched-capacitor circuit that is configured to generate a plurality of discrete voltages based on first voltage, a switch included in a supply modulator that is configured to selectively output at least one of the discrete voltages generated by the switched-capacitor circuit, an IC terminal connected to the at least one switch included in the switched-capacitor circuit, and an IC terminal connected to the switch included in the supply modulator. The module laminate includes a signal line that connects the respective IC terminals.

According to another exemplary aspect, a tracker module is provided that includes a module laminate and at least one integrated circuit that is disposed on the module laminate and that includes a first integrated circuit. The first integrated circuit includes at least one switch included in a first circuit, at least one switch included in a third circuit, a first IC terminal connected to one of the at least one switch included in the third circuit, and a second IC terminal connected to one of the at least one switch included in the first circuit. The at least one integrated circuit includes at least one switch included in a second circuit. The first circuit includes a first capacitor having a first electrode and a second electrode and a second capacitor having a third electrode and a fourth electrode. The at least one switch included in the first circuit includes a first switch, a second switch, a third switch, a fourth switch, a fifth switch, a sixth switch, a seventh switch, and an eighth switch. A first end of the first switch and a first end of the third switch are connected to the first electrode. A first end of the second switch and a first end of the fourth switch are connected to the second electrode. A first end of the fifth switch and a first end of the seventh switch are connected to the third electrode. A first end of the sixth switch and a first end of the eighth switch are connected to the fourth electrode. The second end of the first switch, the second end of the second switch, the second end of the fifth switch, and the second end of the sixth switch are connected to each other. The second end of the third switch is connected to the second end of the seventh switch. The second end of the fourth switch is connected to the second end of the eighth switch. According to the exemplary aspect, the second circuit includes an output terminal. The at least one switch included in the second switch includes a ninth switch connected between the second ends of the first switch, the second switch, the fifth switch, and the sixth switch, and the output terminal, and a tenth switch connected between the second ends of the third switch and the seventh switch, and the output terminal. The third circuit includes an input terminal. The at least one switch included in the third circuit includes an eleventh switch connected between the input terminal and a first end of a power inductor, a twelfth switch connected between the first end of the power inductor and a ground, and a thirteenth switch connected between the second end of the power inductor, and the second ends of the first switch, the second switch, the fifth switch, and the sixth switch. The module laminate includes a first signal line that connects the first IC terminal to the second IC terminal.

According to an exemplary aspect, a communication device is provided that includes a signal processing circuit configured to process a radio-frequency signal, a power amplifier circuit configured to transmit the radio-frequency signal between the signal processing circuit and an antenna, and a tracker module configured to supply power supply voltage to the power amplifier circuit.

According to the exemplary aspects of the present invention, degradation of characteristics is suppressed.

DETAILED DESCRIPTION

Figure 1:
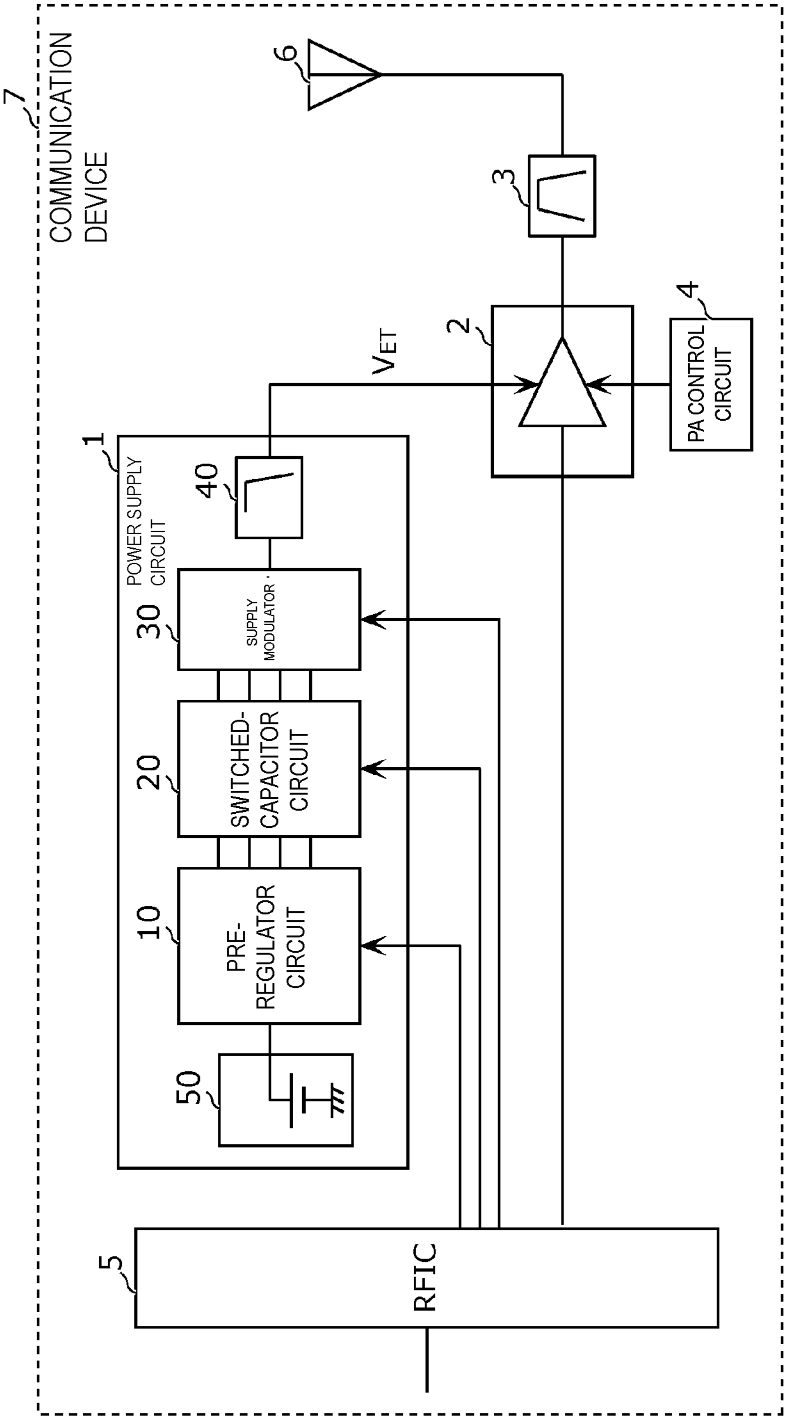
FIG. 1 is a circuit configuration diagram of a power supply circuit and a communication device according to an exemplary embodiment.

Tracker modules and communication devices according to exemplary embodiments will herein be described in detail with reference to the drawings. All the exemplary embodiments described below indicate specific examples of the present disclosure. Accordingly, numerical values, shapes, materials, components, the arrangement of the components, the connection mode of the components, steps, the order of the steps, and so on, which are indicated in the embodiments described below, are only examples and are not intended to limit the exemplary embodiments.

It is noted that the respective drawings are schematic diagrams and are not necessarily strictly illustrated. Accordingly, for example, the scales and so on in the respective drawings do not necessarily coincide with each other. The same reference numerals and letters are used in the respective drawings to identify substantially the same components and a duplicated description of such components is omitted or simplified.

In this description, the terms, such as parallel and vertical, indicating the relationship between elements; the terms, such as rectangles and straight lines, indicating the shapes of the elements; and numerical ranges do not represent only strict meanings but mean inclusion of substantially the same ranges, for example, differences on the order of few percent.

In this description and the drawings, the x axis, the y axis, and the z axis indicate the three axes in the three-dimensional Cartesian coordinate system. Specifically, when a module laminate has a rectangular shape in a plan view, the x axis is parallel to a first side of the module laminate and the y axis is parallel to a second side orthogonal to the first side of the module laminate. The z axis is an axis vertical to the main surfaces of the module laminate. In this description, the positive side of the z axis indicates the "upper direction (or the upper side)", and the negative side thereof indicates the "lower direction (or the lower side)".

In this description, the term "connected" includes not only direct connection with a connection terminal and/or a wiring conductor but also electrical connection via another circuit element. Moreover, the phrase "connected between A and B" means connection to both A and B between A and B.

In the arrangement of components of the present disclosure, a "plan view of the module laminate" is synonymous with a "plan view of the main surfaces of the module laminate" and means viewing an object that is orthographically projected on the x-y plane from the positive side of the z axis. In this description, a "plan view" means a "plan view of the main surfaces of the module laminate" unless otherwise specified.

In addition, in the arrangement of components of the present disclosure, the phrase "arrangement of a component on a module laminate" includes arrangement of the component on the main surface of the module laminate and arrangement of the component in the module laminate. Moreover, the phrase "arrangement of a component on the main surface of the module laminate" includes arrangement of the component above the main surface without being in contact with the main surface (for example, laminating of the component on another component arranged on the main surface with being in contact with the main surface), in addition to arrangement of the component on the main surface with being in contact with the main surface of the module laminate. In addition, the phrase "arrangement of a component on the main surface of the module laminate" mayinclude arrangement of the component in a depression formed in the main surface. The phrase "arrangement of a component in the module laminate" includes a situation in which the entire component is arranged between the main surfaces of the module laminate but part of the component is not covered with the module laminate and a situation in which only part of the component is arranged in the module laminate, in addition to a situation in which the component is capsulated in the module laminate.

In the present disclosure, the term "signal line" means a line other than a ground line set to ground potential.

In this description, ordinal numbers, such as "first" and "second", do not mean the number of components or the order of the components, but are used to avoid confusion between components of the same type and discriminate the components unless otherwise specified.

EXEMPLARY EMBODIMENT

1. Circuit Configuration of Power Supply Circuit 1 and Communication Device 7

A circuit configuration of a power supply circuit 1 and a communication device 7 according to the present embodiment will now be described with reference to FIG. 1. FIG. 1 is a circuit block diagram of the power supply circuit 1 and the communication device 7 according to the embodiment.

1.1 Circuit Configuration of Communication Device 7

First, the circuit configuration of the communication device 7 will be described. As illustrated in FIG. 1, the communication device 7 according to the present embodiment includes the power supply circuit 1, a power amplifier (PA) 2, a filter 3, a PA control circuit 4, a radio-frequency integrated circuit (RFIC) 5, and an antenna 6.

According to an exemplary aspect, the power supply circuit 1 is configured to supply power supply voltage $V_{ET}$ to the power amplifier 2 in a digital envelope tracking (ET) mode. In the digital ET mode, the voltage level of the power supply voltage $V_{ET}$ is selected from multiple discrete voltage levels based on a digital control signal corresponding to an envelope signal and is varied with time.

The envelope signal is a signal indicating the envelope value of a modulated signal (radio-frequency signal). The envelope value is represented by, for example, a square root of ($I^2+Q^2$). Here, (I+Q) represents a constellation point. The constellation point is a point representing a signal modulated through digital modulation on a constellation diagram. The digital ET mode will be described in detail below with reference to FIG. 3A and FIG. 3B.

Although the power supply circuit 1 supplies one power supply voltage $V_{ET}$ to one power amplifier 2 in FIG. 1, the power supply circuit 1 maybe configured to supply the same power supply voltage $V_{ET}$ to multiple power amplifiers. In addition, the power supply circuit 1 can be configured to supply different power supply voltages to multiple power amplifiers.

As illustrated in FIG. 1, the power supply circuit 1 includes a pre-regulator circuit 10, a switched-capacitor circuit 20, a supply modulator 30, a filter circuit 40, and a direct current power source 50.

The pre-regulator circuit 10 is an example of a third circuit and includes a power inductor and switches. The power inductor is an inductor that is configured to step up and/or step down of direct current voltage. The power inductor is arranged in series on a direct current path. Moreover, the pre-regulator circuit 10 is configured to convert input voltage (e.g., a third voltage) into first voltage using the power inductor. Such a pre-regulator circuit 10 maybe called a magnetic regulator or a direct current (DC)-DC converter. The power inductor may be connected (e.g., in parallel) between a series path and ground.

It is noted that the pre-regulator circuit 10 does not necessarily include the power inductor. For example, the pre-regulator circuit 10 maybe a circuit that is configured to perform the step-up by switching between the capacitors arranged on a series arm path and a parallel arm path of the pre-regulator circuit 10.

The switched-capacitor circuit 20 is an example of a first circuit. The switched-capacitor circuit 20 includes multiple capacitors and multiple switches and is configured to generate multiple discrete second voltages having the corresponding multiple discrete voltage levels from the first voltage from the pre-regulator circuit 10. The switched-capacitor circuit 20 mayalso be called a switched-capacitor voltage balancer.

The supply modulator 30 is an example of a second circuit. The supply modulator 30 is configured to selectively supply at least one of the multiple discrete voltages (the multiple second voltages) generated in the switched-capacitor circuit 20 to the filter circuit 40 based on the digital control signal corresponding to the envelope signal. As a result, at least one voltage selected from the multiple discrete voltages is output from the supply modulator 30. The supply modulator 30 is configured to vary an output voltage with time by repeating the selection of the voltage with time.

It is noted that since various circuit elements and/or lines that cause voltage drop, noise, and/or the like can be included in the supply modulator 30, the time waveform of the output voltage from the supply modulator 30 is not necessarily rectangular waves including only the multiple discrete voltages. In other words, the output voltage from the supply modulator 30 mayinclude voltage different from the multiple discrete voltages.

The filter circuit 40 is an example of a fourth circuit that is configured to filter the signal (e.g., the second voltage) from the supply modulator 30. The filter circuit 40 is composed of, for example, a low pass filter (LPF).

Moreover, the direct current power source 50 is configured to supply the direct current voltage to the pre-regulator circuit 10. Although, for example, a rechargeable battery can be used as the direct current power source 50, the direct current power source 50 is not limited to this configuration.

It is noted that the power supply circuit 1 does not necessarily include at least one of the pre-regulator circuit 10, the filter circuit 40, and the direct current power source 50. For example, the power supply circuit 1 does not necessarily include the filter circuit 40 and the direct current power source 50. An arbitrary combination of the pre-regulator circuit 10, the switched-capacitor circuit 20, the supply modulator 30, and the filter circuit 40 maybe integrated into a single circuit. An example of the detailed circuit configuration of the power supply circuit 1 will be described below with reference to FIG. 2.

As shown, the power amplifier 2 is connected between the RFIC 5 and the filter 3. The power amplifier 2 is configured to receive the power supply voltage $V_{ET}$ from the power supply circuit 1 and is configured to receive a bias signal from the PA control circuit 4. The power amplifier 2 amplifies a radio-frequency transmission signal (hereinafter referred to as a transmission signal) in a certain band, which is output from the RFIC 5, and supplies the amplified transmission signal to the antenna 6 via the filter 3.

The filter 3 is connected between the power amplifier 2 and the antenna 6. The filter 3 has a passband including the certain band. Accordingly, the filter 3 can be configured to transmit the transmission signal in the certain band, which is amplified in the power amplifier 2.

The PA control circuit 4 is configured to control the power amplifier 2. The PA control circuit 4 controls the magnitude and the supply timing of bias current (or bias voltage) to be supplied to the power amplifier 2 upon reception of the control signal from the RFIC 5.

The RFIC 5 is an example of a signal processing circuit that processes the radio-frequency signal. Specifically, the RFIC 5 performs signal processing, such as up-conversion, to the transmission signal input from a baseband signal processing circuit (baseband integrated circuit (BBIC)) and supplies the transmission signal resulting from the signal processing to the power amplifier 2.

The RFIC 5 is an example of a control circuit and includes a controller that controls the power supply circuit 1 and the power amplifier 2. The RFIC 5 causes the supply modulator 30 to select the voltage level of the power supply voltage $V_{ET}$ used in the power amplifier 2 from the multiple discrete voltage levels generated in the switched-capacitor circuit 20 based on the envelope signal of the radio-frequency input signal from the BBIC. The power supply circuit 1 outputs the power supply voltage $V_{ET}$ based on the digital envelope tracking in the above manner.

According to an exemplary aspect, part or all of the functions as the controller of the RFIC 5 maybe provided outside the RFIC 5 and may be provided in the BBIC or the power supply circuit 1. For example, the RFIC 5 does not have the control function to select the power supply voltage $V_{ET}$ and the power supply circuit 1 mayhave the control function to select the power supply voltage $V_{ET}$.

The antenna 6 is connected to the output side of the power amplifier 2 and the transmission signal in the certain band, which is output from the power amplifier 2, is transmitted from the antenna 6.

The certain band is a frequency band for a communication system that is built using a radio access technology (RAT). The certain band is defined in advance by standardizing bodies or the likes (for example, 3rd Generation Partnership Project (3GPP)® and Institute of Electrical and Electronics Engineers (IEEE)). A 5th Generation New Radio (5GNR) system, a Long Term Evolution (LTE) system, a Wireless Local Area Network (WLAN) system, or the like is exemplified as the communication system.

It is noted that the communication device 7 illustrated in FIG. 1 is an example and is not limited to this configuration. For example, the communication device 7 does not necessarily include the filter 3, the PA control circuit 4, and the antenna 6. In addition, the communication device 7 mayhave a reception path including a low-noise amplifier and a reception filter. Furthermore, for example, the communication device 7 mayinclude multiple power amplifiers corresponding to different bands.

1.2 Circuit Configuration of Power Supply Circuit 1

Figure 2:
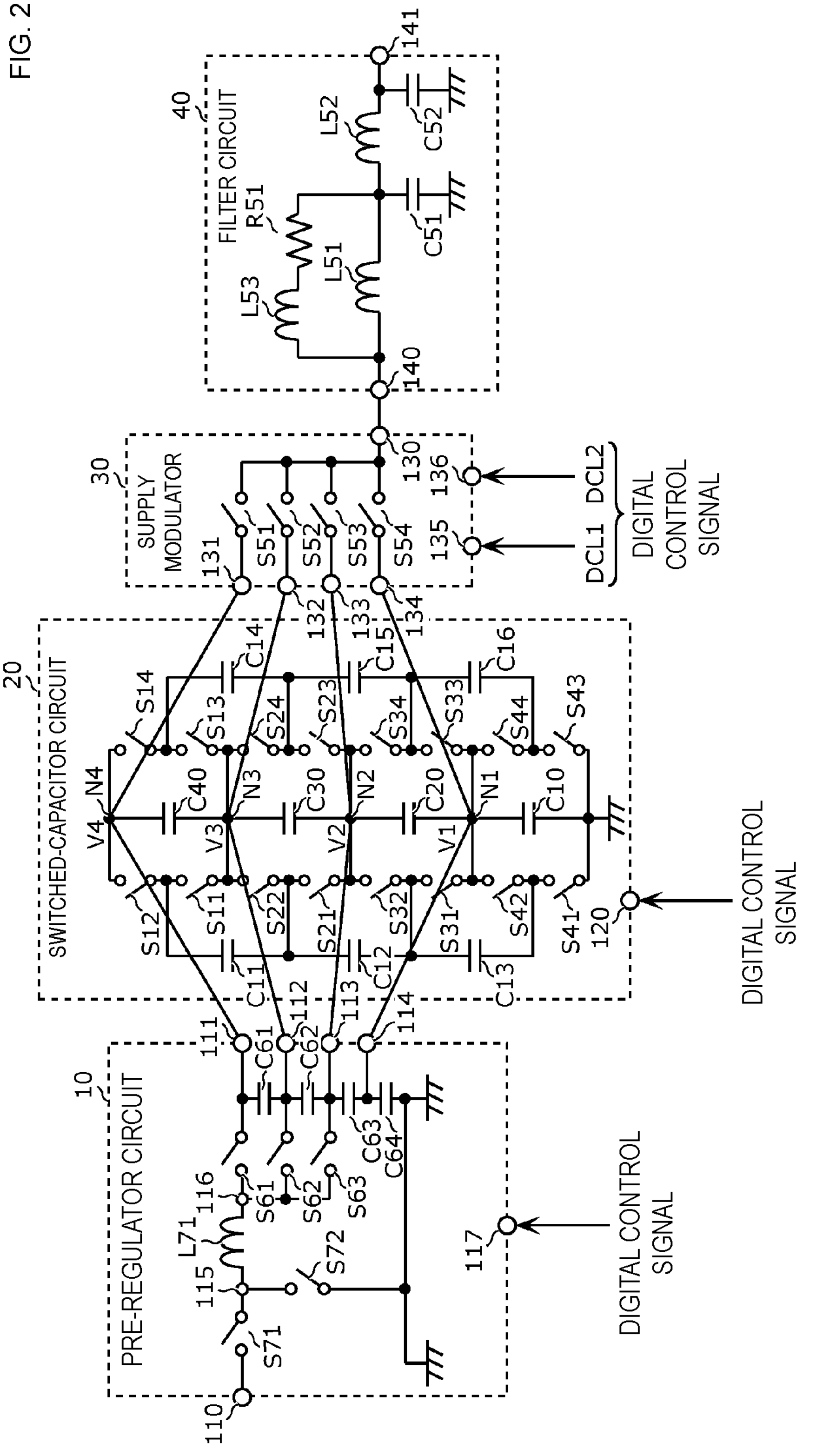
FIG. 2 is a diagram illustrating an example of the circuit configuration of a power supply circuit according to the exemplary embodiment.

Next, the circuit configuration of the pre-regulator circuit 10, the switched-capacitor circuit 20, the supply modulator 30, and the filter circuit 40, which are included in the power supply circuit 1, will be described with reference to FIG. 2. FIG. 2 is a diagram illustrating an example of the circuit configuration of the power supply circuit 1 according to the embodiment.

FIG. 2 illustrates an exemplary circuit configuration. The pre-regulator circuit 10, the switched-capacitor circuit 20, the supply modulator 30, and the filter circuit 40 can be mounted using any of a wide variety of circuit implementations and circuit techniques. Accordingly, the following description of the respective circuits should not be limitedly interpreted.

1.2.1 Circuit Configuration of Switched-Capacitor Circuit 20

First, the circuit configuration of the switched-capacitor circuit 20 will be described. The switched-capacitor circuit 20 includes capacitors C11, C12, C13, C14, C15, and C16, capacitors C10, C20, C30, and C40, switches S11, S12, S13, S14, S21, S22, S23, S24, S31, S32, S33, S34, S41, S42, S43, and S44, and a control terminal 120, as illustrated in FIG. 2.

The control terminal 120 is an input terminal of the digital control signal. Specifically, the control terminal 120 is a terminal for receiving the digital control signal to control the switched-capacitor circuit 20. Although, for example, a source-synchronous control signal that transmits a data signal and a clock signal can be used as the digital control signal received through the control terminal 120, the digital control signal is not limited to this. For example, a clock-embedded method may be applied to the digital control signal.

Each of the capacitors C11 to C16 functions as a flying capacitor (e.g., a "transfer capacitor"). Specifically, each of the capacitors C11 to C16 is configured to step up or step down the first voltage supplied from the pre-regulator circuit 10. More specifically, the capacitors C11 to C16 move electric charge between the capacitors C11 to C16 and nodes N1 to N4 so that voltages V1 to V4 (voltages for the ground potential) meeting V1:V2:V3:V4=1:2:3:4 are kept at the four nodes N1 to N4. The voltages V1 to V4 correspond to the multiple discrete second voltages having the corresponding multiple discrete voltage levels.

The capacitor C11 has two electrodes. One of the two electrodes of the capacitor C11 is connected to one end of the switch S11 and one end of the switch S12. The other of the two electrodes of the capacitor C11 is connected to one end of the switch S21 and one end of the switch S22. For purposes of this disclosure the term "one end" may generally be considered a "first end" and the term "another end" or the "other end" may generally be considered a "second end". These terms for such components may be interchangeable as would be appreciated to one skilled in the art.

The capacitor C12 is an example of a first capacitor and has two electrodes (examples of a first electrode and a second electrode). One of the two electrodes of the capacitor C12 is connected to one end of the switch S21 and one end of the switch S22. The other of the two electrodes of the capacitor C12 is connected to one end of the switch S31 and one end of the switch S32.

The capacitor C13 has two electrodes. One of the two electrodes of the capacitor C13 is connected to one end of the switch S31 and one end of the switch S32. The other of the two electrodes of the capacitor C13 is connected to one end of the switch S41 and one end of the switch S42.

The capacitor C14 has two electrodes. One of the two electrodes of the capacitor C14 is connected to one end of the switch S13 and one end of the switch S14. The other of the two electrodes of the capacitor C14 is connected to one end of the switch S23 and one end of the switch S24.

The capacitor C15 is an example of a second capacitor and has two electrodes (examples of a third electrode and a fourth electrode). One of the two electrodes of the capacitor C15 is connected to one end of the switch S23 and one end of the switch S24. The other of the two electrodes of the capacitor C15 is connected to one end of the switch S33 and one end of the switch S34.

The capacitor C16 has two electrodes. One of the two electrodes of the capacitor C16 is connected to one end of the switch S33 and one end of the switch S34. The other of the two electrodes of the capacitor C16 is connected to one end of the switch S43 and one end of the switch S44.

The capacitors C11 and C13 are also examples of the first capacitor and the capacitors C14 and C16 are also examples of the second capacitor.

Each of a set of the capacitors C11 and C14, a set of the capacitors C12 and C15, and a set of the capacitors C13 and C16 is configured to be complementarily charged and discharged through repetition of a first phase and a second phase.

Specifically, in the first phase, the switches S12, S13, S22, S23, S32, S33, S42, and S43 are turned on. Accordingly, for example, one of the two electrodes of the capacitor C12 is connected to the node N3, the other of the two electrodes of the capacitor C12 and one of the two electrodes of the capacitor C15 are connected to the node N2, and the other of the two electrodes of capacitor C15 is connected to the node N1.

In contrast, in the second phase, the switches S11, S14, S21, S24, S31, S34, S41, and S44 are turned on. Accordingly, for example, one of the two electrodes of the capacitor C15 is connected to the node N3, the other of the two electrodes of capacitor C15 and one of the two electrodes of capacitor C12 are connected to the node N2, and the other of the two electrodes of the capacitor C12 is connected to the node N1.

Repetition of the first phase and the second phase enables, for example, one of the capacitors C12 and C15 to discharge to the capacitor C30 when the other of the capacitors C12 and C15 is charged from the node N2. In other words, the capacitors C12 and C15 are configured to complementarily perform the charging and the discharging. Moreover, the capacitors C12 and C15 can be a pair of flying capacitors that complementarily perform the charging and the discharging according to an exemplary aspect.

A set of any of the capacitors C11, C12, and C13 (the first capacitor) and any of the capacitors C14, C15, and C16 (the second capacitor) also serves as a pair of flying capacitors that complementarily perform the charge from the node and the discharge to a smoothing capacitor by appropriately switching the switches, like the set of the capacitors C12 and C15.

Each of the capacitors C10, C20, C30, and C40 can be configured as the smoothing capacitor. In other words, each of the capacitors C10, C20, C30, and C40 can be configured to keep and smooth the voltages V1 to V4 at the nodes N1 to N4.

The capacitor C10 is an example of a third capacitor and is connected between the node N1 and the ground. Specifically, one (a fifth electrode) of the two electrodes of the capacitor C10 is connected to the node N1. In contrast, the other (a sixth electrode) of the two electrodes of the capacitor C10 is grounded.

The capacitor C20 is connected between the nodes N2 and N1. Specifically, one of the two electrodes of the capacitor C20 is connected to the node N2. In contrast, the other of the two electrodes of the capacitor C20 is connected to the node N1.

The capacitor C30 is connected between the nodes N3 and N2. Specifically, one of the two electrodes of the capacitor C30 is connected to the node N3. In contrast, the other of the two electrodes of the capacitor C30 is connected to the node N2.

The capacitor C40 is connected between the nodes N4 and N3. Specifically, one of the two electrodes of the capacitor C40 is connected to the node N4. In contrast, the other of the two electrodes of the capacitor C40 is connected to the node N3.

The switch S11 is connected between one of the two electrodes of the capacitor C11 and the node N3. Specifically, one end of the switch S11 is connected to one of the two electrodes of the capacitor C11. In contrast, the other end of the switch S11 is connected to the node N3.

The switch S12 is connected between one of the two electrodes of the capacitor C11 and the node N4. Specifically, one end of the switch S12 is connected to one of the two electrodes of the capacitor C11. In contrast, the other end of the switch S12 is connected to the node N4.

The switch S21 is an example of a first switch and is connected between one of the two electrodes of the capacitor C12 and the node N2. Specifically, one end of the switch S21 is connected to one of the two electrodes of the capacitor C12 and the other of the two electrodes of the capacitor C11. In contrast, the other end of the switch S21 is connected to the node N2.

The switch S22 is an example of a third switch and is connected between one of the two electrodes of the capacitor C12 and the node N3. Specifically, one end of the switch S22 is connected to one of the two electrodes of the capacitor C12 and the other of the two electrodes of the capacitor C11. In contrast, the other end of the switch S22 is connected to the node N3.

The switch S31 is an example of a fourth switch and is connected between the other of the two electrodes of the capacitor C12 and the node N1. Specifically, one end of the switch S31 is connected to the other of the two electrodes of the capacitor C12 and one of the two electrodes of the capacitor C13. In contrast, the other end of the switch S31 is connected to the node N1.

The switch S32 is an example of a second switch and is connected between the other of the two electrodes of the capacitor C12 and the node N2. Specifically, one end of the switch S32 is connected to the other of the two electrodes of the capacitor C12 and one of the two electrodes of the capacitor C13. In contrast, the other end of the switch S32 is connected to the node N2. In other words, the other end of the switch S32 is connected to the other end of the switch S21.

The switch S41 is connected between the other of the two electrodes of the capacitor C13 and the ground. Specifically, one end of the switch S41 is connected to the other of the two electrodes of the capacitor C13. In contrast, the other end of the switch S41 is grounded.

The switch S42 is connected between the other of the two electrodes of the capacitor C13 and the node N1. Specifically, one end of the switch S42 is connected to the other of the two electrodes of the capacitor C13. In contrast, the other end of the switch S42 is connected to the node N1. In other words, the other end of the switch S42 is connected to the other end of the switch S31.

The switch S13 is connected between one of the two electrodes of the capacitor C14 and the node N3. Specifically, one end of the switch S13 is connected to one of the two electrodes of the capacitor C14. In contrast, the other end of the switch S13 is connected to the node N3. In other words, the other end of the switch S13 is connected to the other end of the switch S11 and the other end of the switch S22.

The switch S14 is connected between one of the two electrodes of the capacitor C14 and the node N4. Specifically, one end of the switch S14 is connected to one of the two electrodes of the capacitor C14. In contrast, the other end of the switch S14 is connected to the node N4. In other words, the other end of the switch S14 is connected to the other end of the switch S12.

The switch S23 is an example of a fifth switch and is connected between one of the two electrodes of the capacitor C15 and the node N2. Specifically, one end of the switch S23 is connected to one of the two electrodes of the capacitor C15 and the other of the two electrodes of the capacitor C14. In contrast, the other end of the switch S23 is connected to the node N2. In other words, the other end of the switch S23 is connected to the other end of the switch S21 and the other end of the switch S32.

The switch S24 is an example of a seventh switch and is connected between one of the two electrodes of the capacitor C15 and the node N3. Specifically, one end of the switch S24 is connected to one of the two electrodes of the capacitor C15 and the other of the two electrodes of the capacitor C14. In contrast, the other end of the switch S24 is connected to the node N3. In other words, the other end of the switch S24 is connected to the other end of the switch S11, the other end of the switch S22, and the other end of the switch S13.

The switch S33 is an example an eighth switch and is connected between the other of the two electrodes of the capacitor C15 and the node N1. Specifically, one end of the switch S33 is connected to the other of the two electrodes of the capacitor C15 and one of the two electrodes of the capacitor C16. In contrast, the other end of the switch S33 is connected to the node N1. In other words, the other end of the switch S33 is connected to the other end of the switch S31 and the other end of the switch S42.

The switch S34 is an example of a sixth switch and is connected between the other of the two electrodes of the capacitor C15 and the node N2. Specifically, one end of the switch S34 is connected to the other of the two electrodes of the capacitor C15 and one of the two electrodes of the capacitor C16. In contrast, the other end of the switch S34 is connected to the node N2. In other words, the other end of the switch S34 is connected to the other end of the switch S21, the other end of the switch S32, and the other end of the switch S23.

The switch S43 is connected between the other of the two electrodes of the capacitor C16 and the ground. Specifically, one end of the switch S43 is connected to the other of the two electrodes of the capacitor C16. In contrast, the other end of the switch S43 is grounded.

The switch S44 is connected between the other of the two electrodes of the capacitor C16 and the node N1. Specifically, one end of the switch S44 is connected to the other of the two electrodes of the capacitor C16. In contrast, the other end of the switch S44 is connected to the node N1. In other words, the other end of the switch S44 is connected to the other end of the switch S31, the other end of the switch S42, and the other end of the switch S33.

Turning on and off of the switches in a first set including the switches S12, S13, S22, S23, S32, S33, S42, and S43 and the switches in a second set including the switches S11, S14, S21, S24, S31, S34, S41, and S44 is complementarily switched. Specifically, the switches in the first set are turned on and the switches in the second set are turned off in the first phase. In contrast, the switches in the first set are turned off and the switches in the second set are turned on in the second phase.

For example, the charge from the capacitors C11 to C13 to the capacitors C10 to C40 is performed in one of the first phase and the second phase, and the charge from the capacitors C14 to C16 to the capacitors C10 to C40 is performed in the other of the first phase and the second phase. In other words, since the capacitors C10 to C40 are constantly charged from the capacitors C11 to C13 or the capacitors C14 to C16, the nodes N1 to N4 are rapidly supplemented with the electric charge even when the current flows rapidly from the nodes N1 to N4 to the supply modulator 30. Accordingly, potential fluctuation at the nodes N1 to N4 can be suppressed.

The switched-capacitor circuit 20 is configured to maintain substantially the same voltage at both ends of each of the capacitors C10, C20, C30, and C40 through the above operation. Specifically, the voltages V1 to V4 (the voltages for the ground potential) meeting V1:V2:V3:V4=1:2:3:4 are kept at the four nodes labelled with V1 to V4. The voltage levels of the voltages V1 to V4 correspond to the multiple discrete voltage levels supplied to the supply modulator 30 by the switched-capacitor circuit 20.

It is noted that the voltage ratio V1:V2:V3:V4 is not limited to 1:2:3:4. For example, the voltage ratio V1:V2:V3:V4 may be 1:2:4:8 in an alternative aspect.

The configuration of the switched-capacitor circuit 20 illustrated in FIG. 2 is an example and is not limited to this configuration. Although the switched-capacitor circuit 20 is configured to supply the voltages of the four discrete voltage levels in FIG. 2, the switched-capacitor circuit 20 is not limited to this. The switched-capacitor circuit 20 may be configured to supply the voltages of the discrete voltage levels of an arbitrary number not less than two. For example, when the voltages of the two discrete voltage levels are supplied, it is sufficient for the switched-capacitor circuit 20 to at least include the capacitors C12 and C15 and the switches S21, S22, S31, S32, S23, S24, S33, and S34.

1.2.2 Circuit Configuration of Supply Modulator 30

Next, the circuit configuration of the supply modulator 30 will be described. The supply modulator 30 includes input terminals 131 to 134, switch S51, S52, S53, and S54, an output terminal 130, and control terminals 135 and 136, as illustrated in FIG. 2.

The output terminal 130 is connected to the filter circuit 40. The output terminal 130 is a terminal for supplying at least one voltage selected from the voltages V1 to V4 to the power amplifier 2 via the filter circuit 40 as the power supply voltage $V_{ET}$. Since various circuit elements and/or lines that cause voltage drop, noise, and/or the like can be included in the supply modulator 30, as described above, the power supply voltage $V_{ET}$ observed at the output terminal 130 can include voltage different from the voltages V1 to V4.

The input terminals 131 to 134 are connected to the nodes N4 to N1, respectively, in the switched-capacitor circuit 20. The input terminals 131 to 134 are terminals for receiving the voltages V4 to V1, respectively, from the switched-capacitor circuit 20.

The control terminals 135 and 136 are the input terminals of the digital control signals. Specifically, each of the control terminals 135 and 136 is a terminal for receiving the digital control signal indicating one of the voltages V1 to V4. The supply modulator 30 controls turning on and off of the switches S51 to S54 so as to select the voltage level indicated by the digital control signal.

Two digital control line/logic (DCL) signals can be used as the digital control signals received through the control terminals 135 and 136. Each of the two DCL signals is a one-bit signal. One of the voltages V1 to V4 is indicated by a combination of two one-bit signals. For example, the voltages V1, V2, V3, and V4 are indicated by "00", "01", "10", and "11", respectively. The voltage levels may be represented using gray code.

It is noted that although the two DCL signals are used in the present embodiment, the digital control signals are not limited to this. For example, the DCL signals of an arbitrary number that is equal to one or three or more may be used depending on the number of the voltage levels. The digital control signals are not limited to the multiple DCL signals and the source-synchronous control signals may be used as the digital control signals in an alternative aspect.

The switch S51 is connected between the input terminal 131 and the output terminal 130. Specifically, the switch S51 has a terminal connected to the input terminal 131 and a terminal connected to the output terminal 130. In this connection configuration, the switch S51 is configured to switch between connection and non-connection between the input terminal 131 and the output terminal 130 by switching between turning on and turning off.

The switch S52 is an example of a tenth switch and is connected between the input terminal 132 and the output terminal 130. Specifically, the switch S52 has a terminal connected to the input terminal 132 and a terminal connected to the output terminal 130. In this connection circuit, the switch S52 is configured to switch between connection and non-connection between the input terminal 132 and the output terminal 130 by switching between turning on and turning off.

The switch S53 is an example of a ninth switch and is connected between the input terminal 133 and the output terminal 130. Specifically, the switch S53 has a terminal connected to the input terminal 133 and a terminal connected to the output terminal 130. In this connection configuration, the switch S53 is configured to switch between connection and non-connection between the input terminal 133 and the output terminal 130 by switching between turning on and turning off.

The switch S54 is connected between the input terminal 134 and the output terminal 130. Specifically, the switch S54 has a terminal connected to the input terminal 134 and a terminal connected to the output terminal 130. In this connection configuration, the switch S54 is configured to switch between connection and non-connection between the input terminal 134 and the output terminal 130 by switching between turning on and turning off.

These switches S51 to S54 are controlled so as to be exclusively turned on. Specifically, only one of the switches S51 to S54 is turned on and the remaining ones thereof are turned off. Accordingly, the supply modulator 30 is configured to output one voltage selected from the voltages V1 to V4.

The configuration of the supply modulator 30 illustrated in FIG. 2 is an example and is not limited to this. Particularly, it is sufficient for the switches S51 to S54 to select one of the four input terminals 131 to 134 and connect the selected input terminal to the output terminal 130, and the switches S51 to S54 may have any configuration. For example, the supply modulator 30 may further include switches connected between the switches S51 to S53, and the switch S54 and the output terminal 130. In addition, for example, the supply modulator 30 may further include switches connected between the switches S51 and S52, and the switches S53 and S54 and the output terminal 130.

For example, when one voltage is selected from the second voltages of the two discrete voltage levels, it is sufficient for the supply modulator 30 to at least include the switches S52 and S53.

In an exemplary aspect, the supply modulator 30 can be configured to output two or more voltages. In this case, it is sufficient for the supply modulator 30 to further include additional switch sets, which are the same as the set of the switches S51 to S54, of a required number and additional output terminals of a required number.

1.2.3 Circuit Configuration of Pre-Regulator Circuit 10

Next, the circuit configuration of the pre-regulator circuit 10 will be described. As illustrated in FIG. 2, the pre-regulator circuit 10 includes an input terminal 110, output terminals 111 to 114, inductor connection terminals 115 and 116, a control terminal 117, switches S61, S62, S63, S71, and S72, a power inductor L71, and capacitors C61, C62, C63, and C64.

The input terminal 110 is an example of a third input terminal and is an input terminal of the direct current voltage. In other words, the input terminal 110 is a terminal for receiving the input voltage from the direct current power source 50.

The output terminal 111 is an output terminal of the voltage V4. In other words, the output terminal 111 is a terminal for supplying the voltage V4 to the switched-capacitor circuit 20. The output terminal 111 is connected to the node N4 in the switched-capacitor circuit 20.

The output terminal 112 is an output terminal of the voltage V3. In other words, the output terminal 112 is a terminal for supplying the voltage V3 to the switched-capacitor circuit 20. The output terminal 112 is connected to the node N3 in the switched-capacitor circuit 20.

The output terminal 113 is an output terminal of the voltage V2. In other words, the output terminal 113 is a terminal for supplying the voltage V2 to the switched-capacitor circuit 20. The output terminal 113 is connected to the node N2 in the switched-capacitor circuit 20.

The output terminal 114 is an output terminal of the voltage V1. In other words, the output terminal 114 is a terminal for supplying the voltage V1 to the switched-capacitor circuit 20. The output terminal 114 is connected to the node N1 in the switched-capacitor circuit 20.

The inductor connection terminal 115 is connected to one end of the power inductor L71. The inductor connection terminal 116 is connected to the other end of the power inductor L71.

The control terminal 117 is an input terminal of the digital control signal. In other words, the control terminal 117 is a terminal for receiving the digital control signal to control the pre-regulator circuit 10.

The switch S71 is an example of an eleventh switch and is connected between the input terminal 110 and one end of the power inductor L71. Specifically, the switch S71 has a terminal connected to the input terminal 110 and a terminal connected to one end of the power inductor L71 via the inductor connection terminal 115. In this connection configuration, the switch S71 is configured to switch between connection and non-connection between the input terminal 110 and one end of the power inductor L71 by switching between turning on and turning off.

The switch S72 is an example of a twelfth switch and is connected between one end of the power inductor L71 and the ground. Specifically, the switch S72 has a terminal connected to one end of the power inductor L71 via the inductor connection terminal 115 and a terminal connected to the ground. In this connection configuration, the switch S72 is configured to switch between connection and non-connection between one end of the power inductor L71 and the ground by switching between turning on and turning off.

The switch S61 is connected between the other end of the power inductor L71 and the output terminal 111. Specifically, the switch S61 has a terminal connected to the other end of the power inductor L71 and a terminal connected to the output terminal 111. In this connection configuration, the switch S61 is configured to switch between connection and non-connection between the other end of the power inductor L71 and the output terminal 111 by switching between turning on and turning off.

The switch S62 is connected between the other end of the power inductor L71 and the output terminal 112. Specifically, the switch S62 has a terminal connected to the other end of the power inductor L71 and a terminal connected to the output terminal 112. In this connection configuration, the switch S62 is configured to switch between connection and non-connection between the other end of the power inductor L71 and the output terminal 112 by switching between turning on and turning off.

The switch S63 is an example of a thirteenth switch and is connected between the other end of the power inductor L71 and the output terminal 113. Specifically, the switch S63 has a terminal connected to the other end of the power inductor L71 and a terminal connected to the output terminal 113. In this connection configuration, the switch S63 is configured to switch between connection and non-connection between the other end of the power inductor L71 and the output terminal 113 by switching between turning on and turning off.

The capacitor C61 is connected between the output terminal 111 and the output terminal 112. One of the two electrodes of the capacitor C61 is connected to the switch S61 and the output terminal 111, and the other of the two electrodes of the capacitor C61 is connected to the switch S62, the output terminal 112, and one of the two electrodes of the capacitor C62.

The capacitor C62 is connected between the output terminal 112 and the output terminal 113. One of the two electrodes of the capacitor C62 is connected to the switch S62, the output terminal 112, and the other of the two electrodes of the capacitor C61, and the other of the two electrodes of the capacitor C62 is connected to a path connecting the switch S63, the output terminal 113, and one of the two electrodes of the capacitor C63.

The capacitor C63 is an example of a fourth capacitor and is connected between the output terminal 113 and the output terminal 114. One of the two electrodes of the capacitor C63 is connected to the switch S63, the output terminal 113, and the other of the two electrodes of the capacitor C62, and the other of the two electrodes of the capacitor C63 is connected to the output terminal 114 and one of the two electrodes of the capacitor C64.

The capacitor C64 is connected between the output terminal 114 and the ground. One of the two electrodes of the capacitor C64 is connected to the output terminal 114 and the other of the two electrodes of the capacitor C63, and the other of the two electrodes of the capacitor C64 is grounded.

The switches S61 to S63 are controlled so as to be exclusively turned on. Specifically, only one of the switches S61 to S63 is turned on and the remaining ones thereof are turned off. The voltage levels of the voltages V1 to V4 can be varied depending on which switch, among the switches S61 to S63, is turned on.

The pre-regulator circuit 10 having the above configuration supplies the electric charge to the switched-capacitor circuit 20 via at least one of the output terminals 111 to 113.

When the input voltage (e.g., the third voltage) is converted into one first voltage, it is sufficient for the pre-regulator circuit 10 to at least include the switches S71 and S72 and the power inductor L71.

1.2.4 Circuit Configuration of Filter Circuit 40

Next, the circuit configuration of the filter circuit 40 will be described. The filter circuit 40 includes inductors L51, L52, and L53, capacitors C51 and C52, a resistor R51, an input terminal 140, and an output terminal 141, as illustrated in FIG. 2.

The input terminal 140 is an input terminal of the second voltage selected in the supply modulator 30. In other words, the input terminal 140 is a terminal for receiving the second voltage selected from the multiple voltages V1 to V4.

The output terminal 141 is an output terminal of the power supply voltage $V_{ET}$. In other words, the output terminal 141 is a terminal for supplying the power supply voltage $V_{ET}$ to the power amplifier 2.

The inductors L51 and L52 are connected in series to each other between the input terminal 140 and the output terminal 141. A series connection circuit of the inductor L53 and the resistor R51 is connected in parallel to the inductor L51. The capacitor C51 is connected between a node between the inductors L51 and L52 and the ground. The capacitor C52 is connected between the output terminal 141 and the ground.

In the above configuration, the filter circuit 40 comprises an LC low pass filter in which the inductors are arranged on a series arm path and the capacitors are arranged on a parallel arm path. Accordingly, the filter circuit 40 is configured to reduce a radio-frequency component included in the power supply voltage. For example, when the certain band is a frequency band for frequency division duplex (FDD), the filter circuit 40 reduces the component in a downlink operating band of the certain band.

It is noted that the configuration of the filter circuit 40 illustrated in FIG. 2 is an example and is not limited to this. The filter circuit 40 maycompose a band pass filter or a high pass filter depending on the band to be removed, for example.

The filter circuit 40 mayinclude two or more LC filters. It is sufficient for the two or more LC filters to be commonly connected to the output terminal 130 and it is sufficient for each LC filter to have a passband or an attenuation band corresponding to each of the different bands. Alternatively, a first filter group composed of two or more LC filters may be connected to a first output terminal of the supply modulator 30, a second filter group composed of other two or more LC filters may be connected to a second output terminal of the supply modulator 30, and each LC filter may have a passband or an attenuation band corresponding to each of the different bands. In this case, the filter circuit 40 mayhave two or more output terminals and may concurrently supply two or more power supply voltages $V_{ET}$ to the power amplifier 2.

2 Description of Digital ET Mode

The digital ET mode will now be described with reference to FIG. 3A and FIG. 3B while being compared with an ET mode (hereinafter referred to as an analog ET mode) in related art.

Figure 3A:
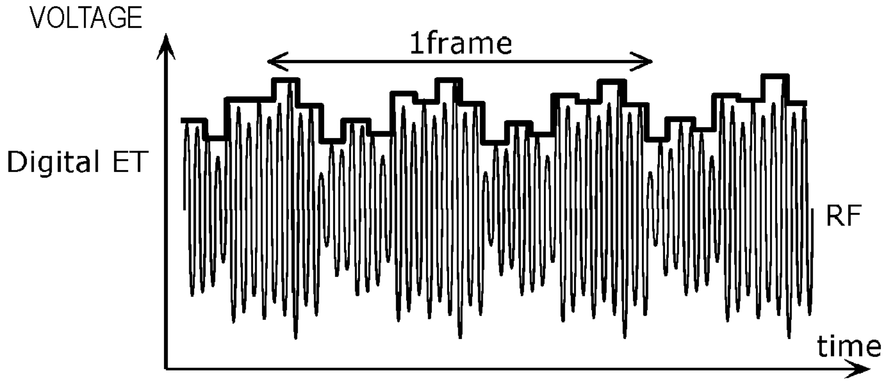
FIG. 3A is a graph indicating an example of transition of power supply voltage in a digital ET mode.

FIG. 3A is a graph indicating an example of transition of the power supply voltage in the digital ET mode. FIG. 3B is a graph indicating an example of transition of the power supply voltage in the analog ET mode. Referring to FIG. 3A and FIG. 3B, the horizontal axis represents time and the vertical axis represents voltage. A thick solid line represents the power supply voltage $V_{ET}$ and a thin solid line (e.g., a waveform) represents the modulated signal.

In the digital ET mode, as illustrated in FIG. 3A, the power supply voltage $V_{ET}$ is varied to the multiple discrete voltage levels in one frame to track the envelope of the modulated signal. As a result, the power supply voltage signal forms a rectangular wave. The power supply voltage level is selected from the multiple discrete voltage levels based on the envelope signal ($\sqrt{(I^2+Q^2)}$) in the digital ET mode.

According to an exemplary aspect, the frame represents a unit composing the radio-frequency signal (e.g., the modulated signal). For example, in the 5th Generation New Radio (5GNR) and the Long Term Evolution (LTE), the frame includes 10 sub-frames, each sub-frame includes multiple slots, and each slot is composed of multiple symbols. The sub-frame length is 1 ms and the frame length is 10 ms.

Figure 3B:
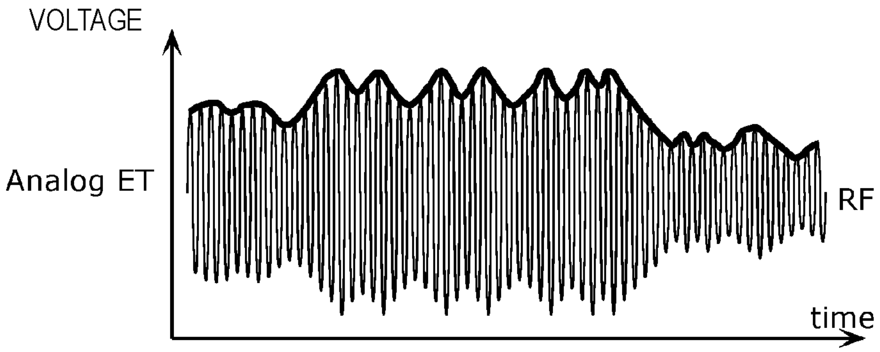
FIG. 3B is a graph indicating an example of transition of the power supply voltage in an analog ET mode.

In the analog ET mode, as illustrated in FIG. 3B, the power supply voltage $V_{ET}$ is continuously varied to track the envelope of the modulated signal. The power supply voltage $V_{ET}$ is determined based on the envelope signal in the analog ET mode. In the analog ET, the power supply voltage $V_{ET}$ can follow the variation in the envelope of the modulated signal when the channel bandwidth is relatively narrow (for example, less than 60 MHz) while the power supply voltage $V_{ET}$ cannot follow the variation in the envelope of the modulated signal when the channel bandwidth is relatively wide (for example, 60 MHz or more). In other words, the variation in amplitude of the power supply voltage $V_{ET}$ is delayed from the variation in the envelope of the modulated signal when the channel bandwidth is relatively wide.

In view of the foregoing problem, when the channel bandwidth is relatively wide (for example, 60 MHz or more), the application of the digital ET mode improves the followability of the power supply voltage $V_{ET}$ to the modulated signal, as illustrated in FIG. 3A.

3 Arrangement of Components in Tracker Modules According to Examples

Next, tracker modules in which the pre-regulator circuit 10 (excluding the power inductor L71), the switched-capacitor circuit 20, the supply modulator 30, and the filter circuit 40 are mounted will be described with reference to the drawings as examples of the power supply circuit 1 having the above configuration.

3.1 First Exemplary Aspect

First, a tracker module 100A according to a first exemplary aspect will be described with reference to FIG. 4 to FIG. 6.

Figure 4:
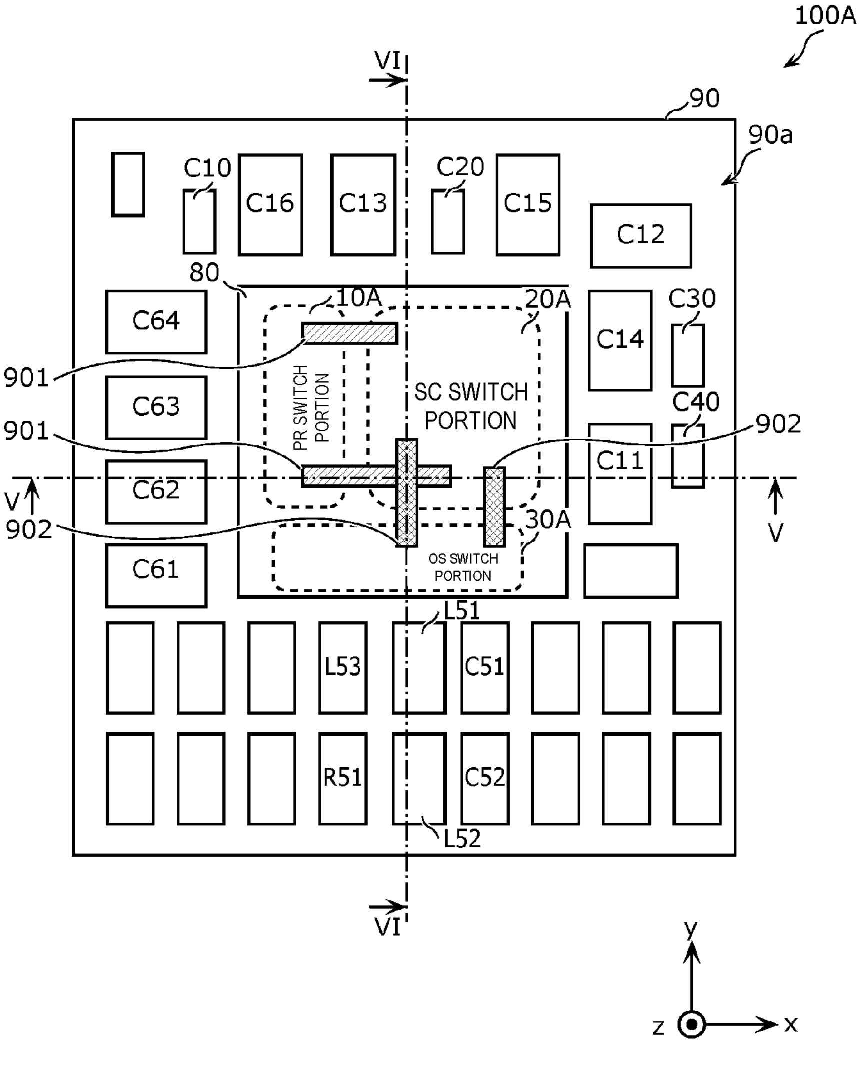
FIG. 4 is a plan view of a tracker module according to a first exemplary aspects.

FIG. 4 is a plan view of the tracker module 100A according to the present example. FIG. 5 is a cross-sectional view of the tracker module 100A according to the exemplary aspect and, specifically, represents the cross section taken along the V-V line in FIG. 4. FIG. 6 is a cross-sectional view of the tracker module 100A according to the present example and, specifically, represents the cross section taken along the VI-VI line in FIG. 4.

Figure 5:
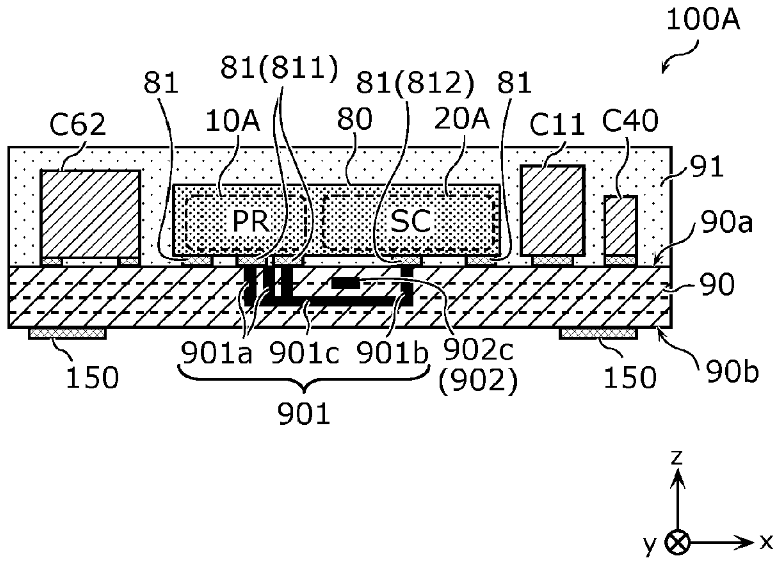
FIG. 5 is a cross-sectional view of the tracker module according to the first exemplary aspect.
Figure 6:
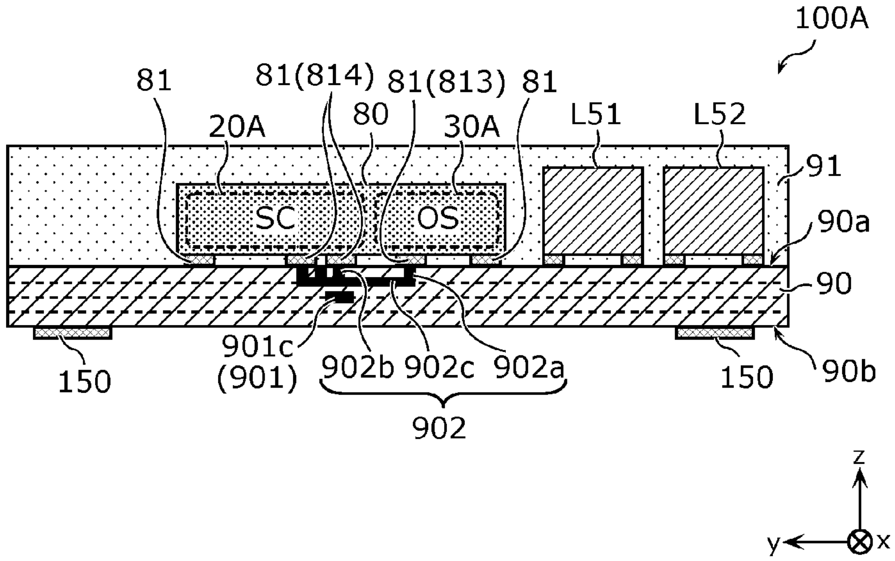
FIG. 6 is a cross-sectional view of the tracker module according to the first exemplary aspect.

As illustrate in FIG. 4 to FIG. 6, the tracker module 100A according to the present example includes a module laminate 90, an integrated circuit 80, the capacitors C10, C20, C30, C40, C11, C12, C13, C14, C15, C16, C51, C52, C61, C62, C63, and C64, the inductors L51, L52, and L53, the resistor R51, and a resin member 91.

The module laminate 90 is a substrate which has a main surface 90*a* and a main surface 90*b* that are opposed to each other and on which circuit components composing the tracker module 100A are mounted. For example, a low temperature co-fired ceramics (LTCC) substrate having a laminated structure of multiple dielectric layers, a high temperature co-fired ceramics (HTCC) substrate, a component-embedded board, a substrate including a redistribution layer (RDL) (for example, an LTCC substrate including the RDL), or a printed circuit board is used as the module laminate 90.

Each of the capacitors C10 to C16, C20, C30, C40, C51, C52, and C61 to C64 is mounted as a chip capacitor. According to an exemplary aspect, the chip capacitor can be a surface mount device (SMD) composing the capacitor. However, it is noted that the mounting of each capacitor is not limited to the chip capacitor. For example, each capacitor may be included in an integrated passive device (IPD).

Each of the inductors L51 to L53 is mounted as a chip inductor. According to an exemplary aspect, chip inductor can be the SMD composing the inductor. However, it is noted that the mounting of each inductor is not limited to the chip inductor. For example, each inductor may be included in the IPD.

The resistor R51 is mounted as a chip resistor. According to an exemplary aspect, the chip resistor can be the SMD composing the resistor. However, it is noted that the mounting of the resistor R51 is not limited to the chip resistor. For example, the resistor R51 may be included in the IPD.

The multiple capacitors, the multiple inductors, and the resistor, which are arranged on the main surface 90*a* in the above manner, are arranged around the integrated circuit 80 with being grouped for each circuit.

For example, the group of the circuit components included in the pre-regulator circuit 10 is arranged near a PR switch portion 10A in the integrated circuit 80. Specifically, the group of the capacitor C61 to C64 included in the pre-regulator circuit 10 is arranged in an area on the main surface 90*a*, which is sandwiched between a straight line along the left side of the integrated circuit 80 and a straight line along the left side of the module laminate 90, in a plan view of the module laminate 90.

For example, the group of the circuit components included in the switched-capacitor circuit 20 is arranged near an SC switch portion 20A in the integrated circuit 80. Specifically, the group of the capacitors C10 to C16, C20, C30, and the C40 included in the switched-capacitor circuit 20 is arranged in an area on the main surface 90*a*, which is sandwiched between a straight line along the upper side of the integrated circuit 80 and a straight line along the upper side of the module laminate 90, and an area on the main surface 90*a*, which is sandwiched between a straight line along the right side of the integrated circuit 80 and a straight line along the right side of the module laminate 90, in a plan view of the module laminate 90.

For example, the group of the circuit components included in the filter circuit 40 is arranged near an OS switch portion 30A in the integrated circuit 80. The group of the capacitor C51 and C52, the inductors L51 to L53, and the resistor R51 included in the filter circuit 40 is arranged in an area on the main surface 90*a*, which is sandwiched between a straight line along the lower side of the integrated circuit 80 and a straight line along the lower side of the module laminate 90, in a plan view of the module laminate 90.

Multiple land electrodes 150 are arranged on the main surface 90*b*. The multiple land electrodes 150 function as multiple external connection terminals including a ground terminal, in addition to the input terminal 110, the output terminal 141, the inductor connection terminals 115 and 116, and the control terminals 117, 120, 135, and 136 illustrated in FIG. 2. The multiple land electrodes 150 are electrically connected to multiple electronic components arranged on the main surface 90*a* by via conductors and so on formed in the module laminate 90. It is noted that although copper electrodes may be used as the multiple land electrodes 150, the land electrodes 150 are not limited to this. For example, solder electrodes may be used as the multiple land electrodes. Alternatively, multiple bump electrodes or multiple post electrodes may be used as the multiple external connection terminals, instead of the multiple land electrodes 150.

The resin member 91 covers at least part of the multiple electronic components on the main surface 90*a* and the main surface 90*b*. The resin member 91 has a function to ensure the reliabilities, such as the mechanical strength and the moisture resistance, of the multiple electronic components on the main surface 90*a*. The resin member 91 is not necessarily included in the tracker module 100A.

It is noted that the configuration of the tracker module 100A according to the present example is an example and is not limited to the above one. For example, part of the capacitors and the inductors arranged on the main surface 90*a* may be formed in the module laminate 90. Part of the capacitors and the inductors arranged on the main surface 90*a* are not necessarily included in the tracker module 100A.

The integrated circuit 80 is a semiconductor integrated circuit (IC) and is composed, for example, using complementary metal oxide semiconductor (CMOS). Specifically, the integrated circuit 80 is manufactured using an Si substrate or a Silicon on Insulator (SOI) substrate. Alternatively, the integrated circuit 80 maybe made of at least one of GaAs, SiGe, and GaN. The semiconductor material of the integrated circuit 80 is not limited to the above materials.

The integrated circuit 80 is an example of a first integrated circuit. The integrated circuit 80 includes the PR switch portion 10A, the SC switch portion 20A, the OS switch portion 30A, and multiple bump electrodes 81.

The PR switch portion 10A is composed of the switches included in the pre-regulator circuit 10. Specifically, the PR switch portion 10A includes the switches S61, S62, S63, S71, and S72.

The SC switch portion 20A is composed of the switches included in the switched-capacitor circuit 20. Specifically, the SC switch portion 20A includes the switches S11, S12, S13, S14, S21, S22, S23, S24, S31, S32, S33, S34, S41, S42, S43, and S44.

The OS switch portion 30A is composed of the switches included in the supply modulator 30. Specifically, the OS switch portion 30A includes the switches S51, S52, S53, and S54.

The multiple bump electrodes 81 are electrically connected to other bump electrodes 81, the multiple circuit components arranged on the main surface 90*a*, the multiple land electrodes 150 arranged on the main surface 90*b*, and so on via wiring layers, the via conductors, or the likes formed in the module laminate 90. The multiple bump electrodes 81 include bump electrodes 811, 812, 813, and 814.

The bump electrode 811 is an example of a first IC terminal and is connected to the switches included in the pre-regulator circuit 10. Specifically, the bump electrode 811 is connected to one of the switches S61, S62, and S63 included in the PR switch portion 10A in the integrated circuit 80. More specifically, the bump electrode 811 corresponds to one of the output terminals 111 to 114 of the pre-regulator circuit 10.

The bump electrode 812 is an example of a second IC terminal and is connected to the switches included in the switched-capacitor circuit 20. Specifically, the bump electrode 812 is connected to at least one of the switches S11, S12, S13, S14, S21, S22, S23, S24, S31, S32, S33, S34, S42, and S44 included in the SC switch portion 20A in the integrated circuit 80. More specifically, the bump electrode 812 corresponds to one of the nodes N1 to N4 in the switched-capacitor circuit 20.

The bump electrode 813 is an example of a third IC terminal and is connected to the switches included in the supply modulator 30. Specifically, the bump electrode 813 is connected to one of the switches S51, S52, S53, and S54 included in the OS switch portion 30A in the integrated circuit 80. More specifically, the bump electrode 813 corresponds to one of the input terminals 131 to 134 of the supply modulator 30.

The bump electrode 814 is an example of a fourth IC terminal and is connected to the switches included in the switched-capacitor circuit 20. Specifically, the bump electrode 814 is connected to at least one of the switches S11, S12, S13, S14, S21, S22, S23, S24, S31, S32, S33, S34, S42, and S44 included in the SC switch portion 20A in the integrated circuit 80. More specifically, the bump electrode 814 corresponds to one of the nodes N1 to N4 in the switched-capacitor circuit 20. The bump electrode 814 is the same as the bump electrode 812, and the bump electrode 814 and the bump electrode 812 may be composed as one electrode.

As illustrated in FIG. 5, the bump electrodes 811 are connected to the bump electrode 812 via a signal line 901. The signal line 901 is an example of a first signal line of the module laminate 90. As illustrated in FIG. 4, the signal line 901 is a signal line with which the PR switch portion 10A is connected to the SC switch portion 20A. The module laminate 90 includes multiple signal lines 901.

The signal line 901 is formed on the surface of the module laminate 90 or inside the module laminate 90. For purposes of this disclosure, the term "surface" means an outer surface of the module laminate 90 and is, for example, the main surface 90*a* or 90*b*. Moreover, the term "inside" means a portion that is between the main surface 90*a* and the main surface 90*b* and that is not exposed from the outer surface of the module laminate 90. In the exemplary aspect where the module laminate 90 includes the redistribution layer (RDL), the "surface or inside" includes the redistribution layer. In other words, the signal line 901 may be provided in the redistribution layer. The same applies to a signal line 902 described below.

Specifically, the signal line 901 includes via conductors 901*a* and 901*b* and a wiring layer 901*c*. The upper ends of the via conductors 901*a* are connected to the bump electrodes 811 and the lower ends thereof are connected to the wiring layer 901*c*. The upper end of the via conductor 901*b* is connected to the bump electrode 812 and the lower end thereof is connected to the wiring layer 901*c*.

As illustrated in FIG. 6, the bump electrode 813 is connected to the bump electrodes 814 via the signal line 902. The signal line 902 is an example of a second signal line of the module laminate 90. As illustrated in FIG. 4, the signal line 902 is a signal line with which the SC switch portion 20A is connected to the OS switch portion 30A. The module laminate 90 includes multiple signal lines 902.

The signal line 902 is formed on the surface of the module laminate 90 or inside the module laminate 90. Specifically, the signal line 902 includes via conductors 902*a* and 902*b* and a wiring layer 902*c*. The upper end of the via conductor 902*a* is connected to the bump electrode 813 and the lower end thereof is connected to the wiring layer 902*c*. The upper ends of the via conductors 902*b* are connected to the bump electrodes 814 and the lower ends thereof are connected to the wiring layer 902*c*.

In the present example, as illustrated in FIG. 4 to FIG. 6, the signal line 901 is overlapped with the signal line 902 in a plan view. The signal line 901 is positioned closer to the main surface 90*b* than the signal line 902. Although the wiring layer 901*c* of the signal line 901 is positioned in the module laminate 90, the wiring layer 901*c* of the signal line 901 may be provided on the main surface 90*b*. Although the wiring layer 902*c* of the signal line 902 is positioned in the module laminate 90, the wiring layer 902*c* of the signal line 902 may be provided on the main surface 90*a*. In this case, the signal line 902 does not include the via conductors 902*a* and 902*b*.

The signal line 901 may be positioned closer to the main surface 90*a* than the signal line 902. In this case, the signal line 901 does not include the via conductors 901*a* and 901*b* and the wiring layer 901*c* may be provided on the main surface 90*a*.

In an exemplary aspect, all of the multiple signal lines 901 and 902 may be formed in the wiring layer at the same height when the multiple signal lines 901 and 902 are not overlapped with each other in a plan view.

In the present example, as illustrated in FIG. 5 and FIG. 6, the two bump electrodes 811 and the two bump electrodes 814 are provided in the exemplary configuration. With this configuration, since the connection area of the integrated circuit 80 and the module laminate 90 is increased, electrical contact resistance can be reduced to improve efficiency. In addition, since thermal conduction from the integrated circuit 80 to the module laminate 90 is efficiently performed, heat dissipation can also be improved.

It should be appreciated that the numbers of the respective bump electrodes 811 to 814 are not particularly limited. One bump electrode 811, one bump electrode 812, one bump electrode 813, and one bump electrode 814 may be provided. Alternatively, the multiple bump electrodes 811, the multiple bump electrodes 812, the multiple bump electrodes 813, and the multiple bump electrodes 814 may be provided.

The multiple via conductors 901*a* and the multiple via conductors 902*b* are provided in response to the provision of the multiple bump electrodes 811 and the multiple bump electrodes 814. For example, as illustrated in FIG. 5, the three via conductors 901*a*are connected to the two bump electrodes 811. In addition, as illustrated in FIG. 6, the three via conductors 902*b* are connected to the two bump electrodes 814. Similarly, the multiple via conductors 901*b* and the multiple via conductors 902*a* may be provided.

According to the exemplary aspect, the multiple via conductors increase the cross-sectional area of the signal lines 901 and 902. The cross-sectional area is an area of a cross section orthogonal to the extending direction of the signal line. The extending direction is a direction along the path of the signal line from one end of the signal line (a portion that is in contact with the bump electrode) to the other end of the signal line (a portion that is in contact with the bump electrode). For example, the extending direction of the signal line is a direction in which the current flows. Specifically, for the via conductor, the cross-sectional area means a cross-sectional area of the cross section parallel to the main surface 90*a* of the module laminate 90. For the wiring layer, the cross-sectional area means a cross-sectional area of the cross section orthogonal to the main surface 90*a* of the module laminate 90. Increasing in the cross-sectional area reduces the resistance of the signal lines 901 and 902 to improve the efficiency.

Both of the signal lines 901 and 902 are signal lines that start from the integrated circuit 80 and return to the same integrated circuit 80. In other words, in the exemplary aspect, part of the signal lines with which the elements in the integrated circuit 80 are connected is provided in the module laminate 90. It is easy to increase the width and the thickness of the signal lines provided in the module laminate 90 to reduce the resistance thereof, compared with the signal lines provided in the integrated circuit 80. Accordingly, the provision of the signal lines in the module laminate 90 enables loss caused by the signal lines to be reduced to realize the highly efficient tracker module 100A.

The integrated circuit 80 is thermally connected to the module laminate 90 via the multiple bump electrodes 81 and the signal lines 901 and 902. The multiple bump electrodes 81 and the signal lines 901 and 902 can be formed of a material, such as metal, that has high thermal conductivity. Accordingly, heat generated in the integrated circuit 80 can be efficiently transmitted to the module laminate 90. The heat transmitted to the module laminate 90 can be dissipated to a motherboard (not illustrated) via the land electrodes 150. It is possible to improve the heat dissipation in the above manner. The improvement of the heat dissipation suppresses the influence of the heat to the circuit elements included in the integrated circuit 80 to realize the highly efficient tracker module 100A.

The relationship between the signal lines 901 and 902 provided in the module laminate 90 and the circuit configuration of the power supply circuit 1 will now be described.

In particular, the signal line 901 is a signal line to supply the first voltage generated in the pre-regulator circuit 10 to the switched-capacitor circuit 20. The signal line 902 is a signal line to supply one of the multiple second voltages generated in the switched-capacitor circuit 20 to the supply modulator 30.

Figure 7:
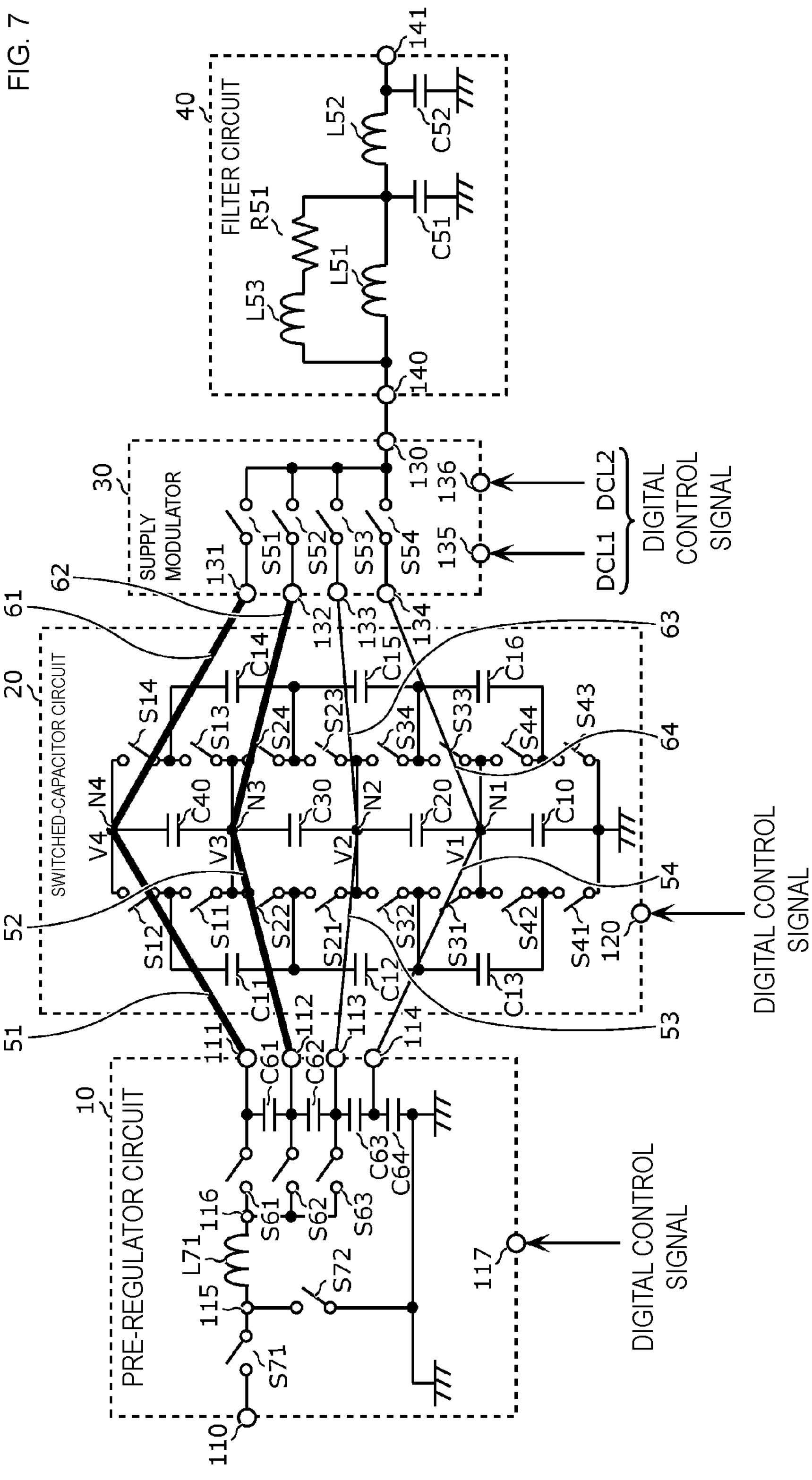
FIG. 7 is a circuit configuration diagram illustrating an example of the relationship between signal lines in a module laminate and the circuit configuration in each example.

Specifically, the signal line 901 is one of four signal lines 51, 52, 53, and 54 illustrated in FIG. 7. The signal line 902 is one of four signal lines 61, 62, 63, and 64 illustrated in FIG. 7. FIG. 7 is a circuit configuration diagram illustrating an example of the relationship between the signal lines in the module laminate 90 and the circuit configuration in an example.

The signal line 51 is a line with which the output terminal 111 is connected to the node N4. The signal line 52 is a line with which the output terminal 112 is connected to the node N3. The signal line 53 is a line with which the output terminal 113 is connected to the node N2. The signal line 54 is a line with which the output terminal 114 is connected to the node N1.

The signal line 61 is a line with which the node N4 is connected to the input terminal 131. The signal line 62 is a line with which the node N3 is connected to the input terminal 132. The signal line 63 is a line with which the node N2 is connected to the input terminal 133. The signal line 64 is a line with which the node N1 is connected to the input terminal 134.

When the signal line 901 is the signal line 51, the bump electrode 811 corresponds to the output terminal 111 and the bump electrode 812 corresponds to the node N4. In other words, the bump electrode 811 is connected to the switch S61 in the pre-regulator circuit 10. The bump electrode 812 is connected to the switches S12 and S14 in the switched-capacitor circuit 20.

When the signal line 901 is the signal line 52, the bump electrode 811 corresponds to the output terminal 112 and the bump electrode 812 corresponds to the node N3. In other words, the bump electrode 811 is connected to the switch S62 in the pre-regulator circuit 10. The bump electrode 812 is connected to the switches S11, S13, S22, and S24 in the switched-capacitor circuit 20.

When the signal line 901 is the signal line 53, the bump electrode 811 corresponds to the output terminal 113 and the bump electrode 812 corresponds to the node N2. In other words, the bump electrode 811 is connected to the switch S63 in the pre-regulator circuit 10. The bump electrode 812 is connected to the switches S21, S23, S32, and S34 in the switched-capacitor circuit 20.

When the signal line 901 is the signal line 54, the bump electrode 811 corresponds to the output terminal 114 and the bump electrode 812 corresponds to the node N1. The bump electrode 811 is indirectly connected to the switch S72 in the pre-regulator circuit 10. The bump electrode 812 is connected to the switches S31, S33, S42, and S44 in the switched-capacitor circuit 20.

When the signal line 902 is the signal line 61, the bump electrode 814 corresponds to the node N4 and the bump electrode 813 corresponds to the input terminal 131. In other words, the bump electrode 814 is connected to the switches S12 and S14 in the switched-capacitor circuit 20. The bump electrode 813 is connected to the switch S51 in the supply modulator 30.

When the signal line 902 is the signal line 62, the bump electrode 814 corresponds to the node N3 and the bump electrode 813 corresponds to the input terminal 132. In other words, the bump electrode 814 is connected to the switches S11, S13, S22, and S24 in the switched-capacitor circuit 20. The bump electrode 813 is connected to the switch S52 in the supply modulator 30.

When the signal line 902 is the signal line 63, the bump electrode 814 corresponds to the node N2 and the bump electrode 813 corresponds to the input terminal 133. In other words, the bump electrode 814 is connected to the switches S21, S23, S32 and S34 in the switched-capacitor circuit 20. The bump electrode 813 is connected to the switch S53 in the supply modulator 30.

When the signal line 902 is the signal line 64, the bump electrode 814 corresponds to the node N1 and the bump electrode 813 corresponds to the input terminal 134. In other words, the bump electrode 814 is connected to the switches S31, S33, S42, and S44 in the switched-capacitor circuit 20. The bump electrode 813 is connected to the switch S54 in the supply modulator 30.

As described above, the high efficiency and the improvement of the heat dissipation of the tracker module 100A are expected by providing the signal lines in the module laminate 90. For example, realizing all the signal lines 51 to 54 and 61 to 64 by the signal lines 901 and 902 provided in the module laminate 90 enables the efficiency and the heat dissipation to be sufficiently improved.

In contrast, due to the size of the module laminate 90, it may be possible not to provide the eight signal lines. In other words, when the number of the signal lines to be provided in the module laminate 90 is limited, priority is given to the signal lines through which the voltage signals of high voltage values are transmitted. Accordingly, the loss of the signal lines of high voltages can be suppressed to improve the efficiency.

As described above, the switched-capacitor circuit 20 operates so that the voltages V1 to V4 are kept at the nodes N1 to N4, respectively. The voltages V1 to V4 meet $V1<V2<V3<V4$. Specifically, the signal line 51 is a signal line through which the voltage signal of the highest voltage value is transmitted, among the signal lines 51 to 54. The signal line 52 is a signal line through which the voltage signal of the second highest voltage value is transmitted, among the signal lines 51 to 54. The signal line 53 is a signal line through which the voltage signal of the third highest voltage value is transmitted, among the signal lines 51 to 54. The signal line 54 is a signal line through which the voltage signal of the fourth highest voltage value (that is, of the lowest voltage value) is transmitted, among the signal lines 51 to 54.

The same applies to the signal lines 61 to 64. Specifically, the signal line 61 is a signal line through which the voltage signal of the highest voltage value is transmitted, among the signal lines 61 to 64. The signal line 62 is a signal line through which the voltage signal of the second highest voltage value is transmitted, among the signal lines 61 to 64. The signal line 63 is a signal line through which the voltage signal of the third highest voltage value is transmitted, among the signal lines 61 to 64. The signal line 64 is a signal line through which the voltage signal of the fourth highest voltage value (that is, of the lowest voltage value) is transmitted, among the signal lines 61 to 64.

For example, there is a case in which only two signal lines 901 and only two signal lines 902 are provided, as in the tracker module 100A illustrated in FIG. 4. In this case, the two respective signal lines 901 provided in the module laminate 90 are, for example, the signal lines 51 and 52, as illustrated by thick solid lines in FIG. 7. The two respective signal lines 902 are the signal lines 61 and 62. For example, when only one signal line 901 and only one signal line 902 are provided, the signal lines 901 and 902 are the signal lines 51 and 61, respectively.

The signal lines 901 and 902 are not limited to the signal lines 51 and 61 of the highest voltages. For example, the signal lines 901 and 902 may be one of the signal lines 52 to 54 and one of the signal lines 62 to 64, respectively.

The priority order of the signal lines is not limited to the order based on the voltage values. For example, priority may be given to the signal line 901 (the signal lines 51 to 54) with which the pre-regulator circuit 10 is connected to the switched-capacitor circuit 20. In other words, the module laminate 90 mayinclude one or more signal lines 901 and does not necessarily include the signal line 902.

Figure 8:
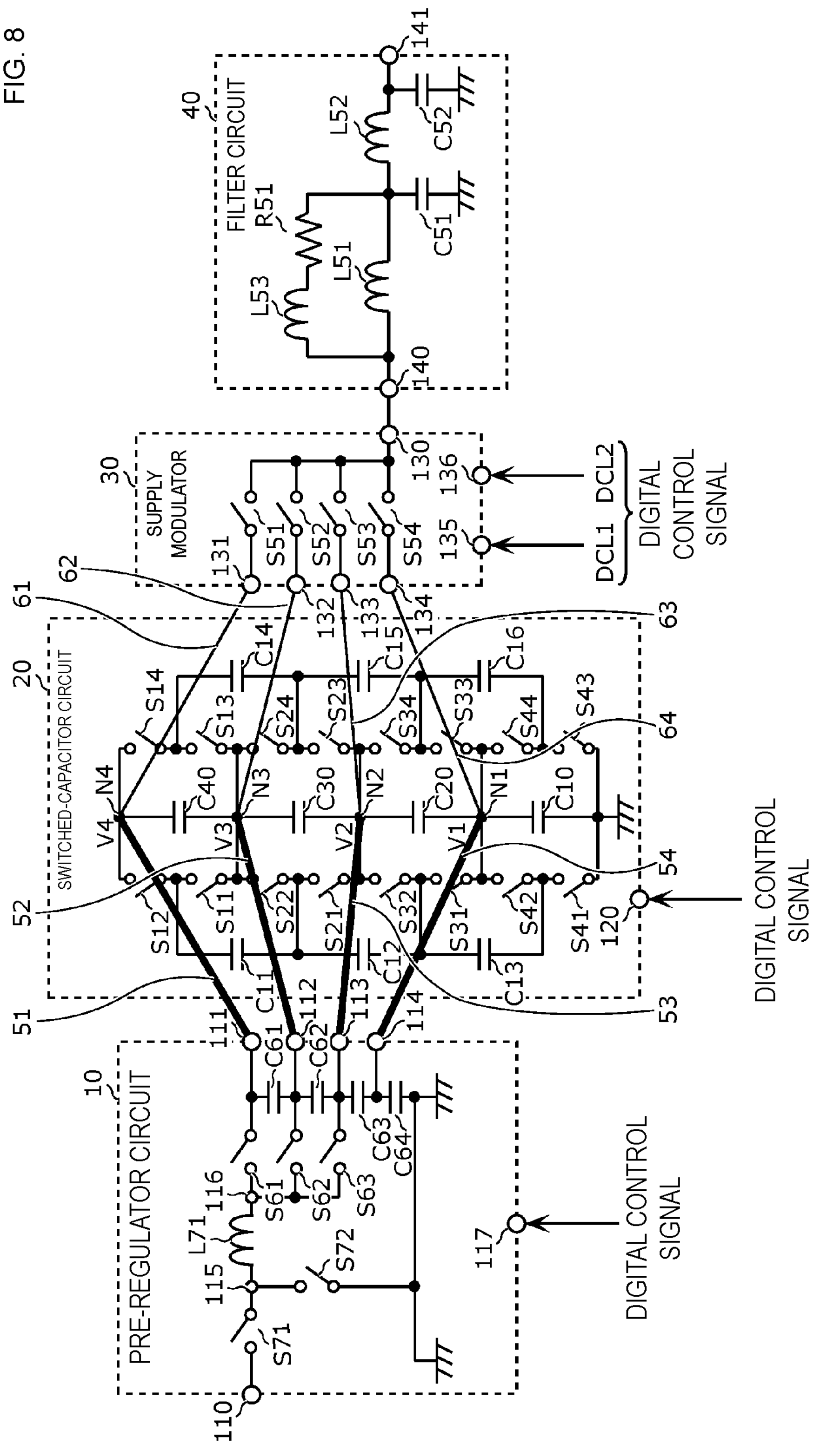
FIG. 8 is a circuit configuration diagram illustrating another example of the relationship between the signal lines in the module laminate and the circuit configuration in each example.

FIG. 8 is a circuit configuration diagram illustrating an example of the relationship between the signal lines in the module laminate 90 and the circuit configuration in an example. For example, when the multiple signal lines can be provided in the module laminate 90, the respective signal lines 51 to 54 with which the pre-regulator circuit 10 is connected to the switched-capacitor circuit 20 are provided in the module laminate 90 as the four signal lines 901, as illustrated by thick solid lines in FIG. 8.

The signal lines 51 to 54 have a high frequency of transmission of the voltage signal in order to keep the voltages V1 to V4 at the nodes N1 to N4, respectively, in the switched-capacitor circuit 20. Providing the signal lines 51 to 54 having a high frequency as the signal lines 901 in the module laminate 90 enables the efficiency of the tracker module 100A to be improved.

3.2 Second Exemplary Aspect

Next, a tracker module 100B according to a second exemplary aspect will be described with reference to FIG. 9 to FIG. 10. The following description focuses on points different from the first exemplary aspect and description of points common to the first exemplary aspect is omitted or simplified.

Figure 9:
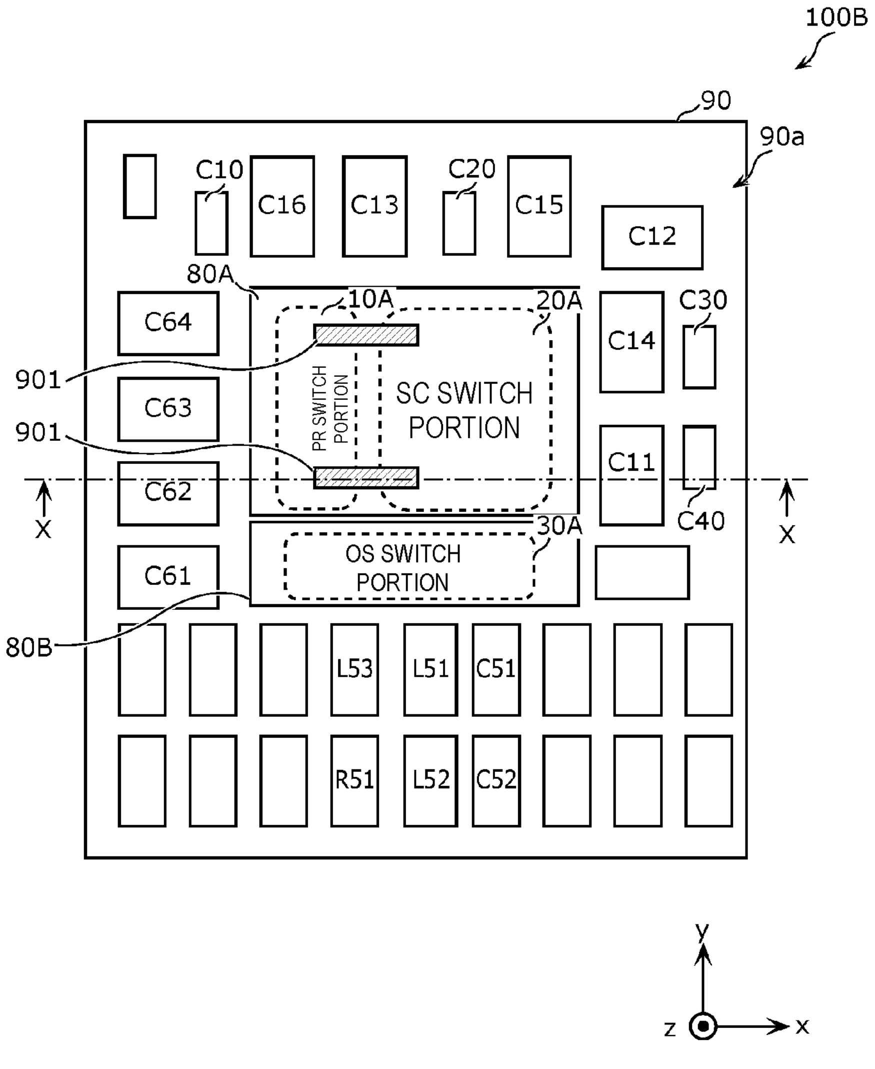
FIG. 9 is a plan view of a tracker module according to a second exemplary aspect.

FIG. 9 is a plan view of the tracker module 100B according to the exemplary aspect. FIG. 10 is a cross-sectional view of the tracker module 100B according to the present example and, specifically, represents the cross section taken along the X-X line in FIG. 9.

As illustrated in FIG. 9, the tracker module 100B according to the exemplary aspect differs from the tracker module 100A according to the first exemplary aspect in provision of integrated circuits 80A and 80B, instead of the integrated circuit 80.

Each of the integrated circuits 80A and 80B is a semiconductor IC and is composed, for example, using the CMOS. Specifically, each of the integrated circuits 80A and 80B is manufactured using an Si substrate or an SOI substrate. Alternatively, the integrated circuits 80A and 80B may be made of at least one of GaAs, SiGe, and GaN. The semiconductor material of the integrated circuits 80A and 80B is not limited to the above materials.

The integrated circuit 80A is an example of the first integrated circuit. The integrated circuit 80A includes the PR switch portion 10A, the SC switch portion 20A, and the multiple bump electrodes 81.

The integrated circuit 80B is an example of a second integrated circuit. The integrated circuit 80B includes the OS switch portion 30A.

As described above, in the present exemplary aspect, the PR switch portion 10A, the SC switch portion 20A, and the OS switch portion 30A are dispersedly arranged in the multiple integrated circuits. The signal lines with which the integrated circuit 80A is connected to the integrated circuit 80B are arranged in the module laminate 90, although not illustrated in FIG. 9 and FIG. 10.

Figure 10:
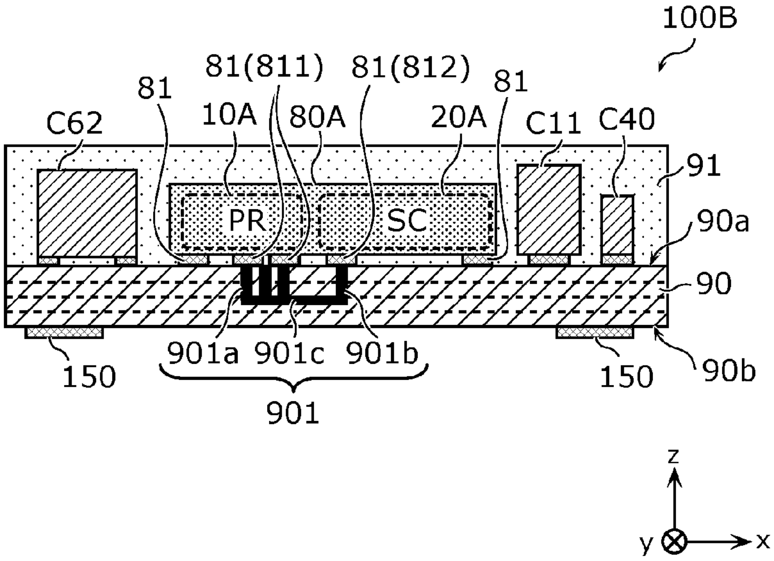
FIG. 10 is a cross-sectional view of the tracker module according to the second exemplary aspect.

In the present exemplary aspect, as illustrated in FIG. 9 and FIG. 10, the signal lines 901 with which the PR switch portion 10A is connected to the SC switch portion 20A in the integrated circuit 80A are provided in the module laminate 90. The specific configuration of the signal lines 901 is the same as that in the first exemplary aspect.

Each of one or multiple signal lines 901 is any of the signal lines 51 to 54 illustrated in FIG. 7. Also, in the tracker module 100B according to the present exemplary aspect, the efficiency and the heat dissipation can be improved as in the first exemplary aspect.

3.3 Third Exemplary Aspect

Next, a tracker module 100C according to a third exemplary aspect will be described with reference to FIG. 11 to FIG. 12. The following description focuses on points different from the first exemplary aspect and description of points common to the first exemplary aspect is omitted or simplified.

Figure 11:
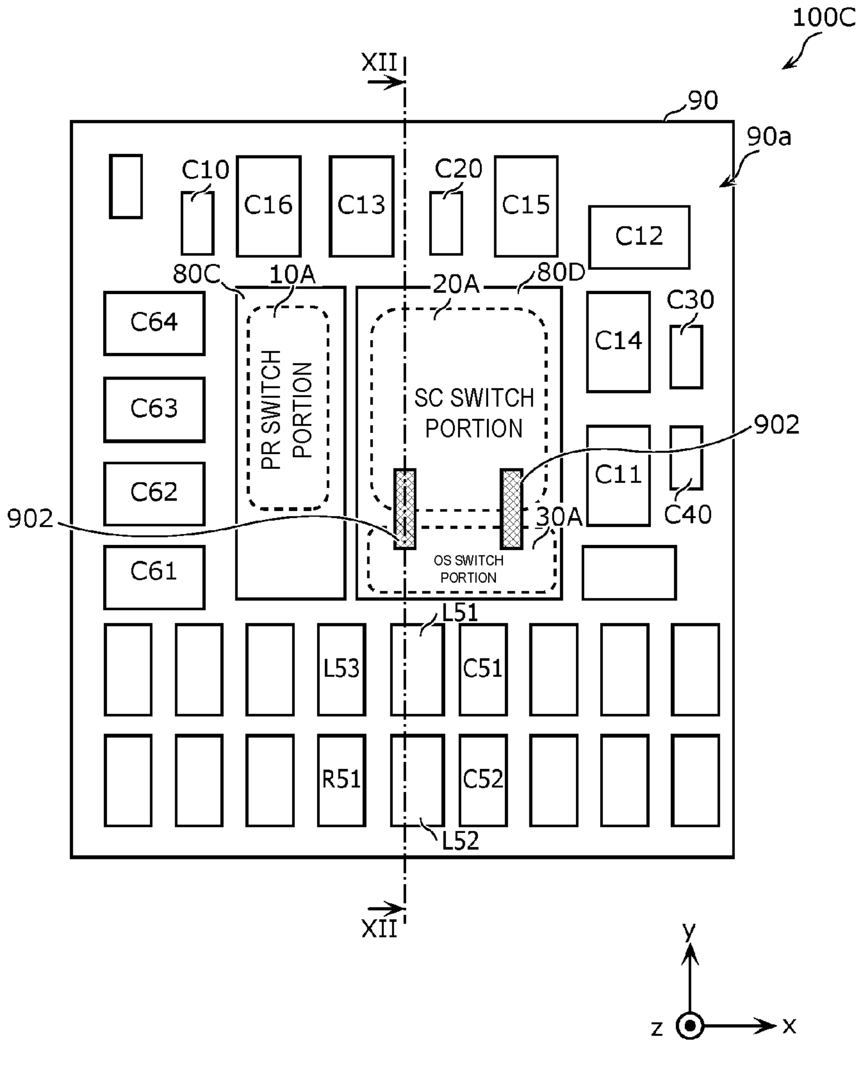
FIG. 11 is a plan view of a tracker module according to a third exemplary aspect.

FIG. 11 is a plan view of the tracker module 100C according to the present exemplary aspect. FIG. 12 is a cross-sectional view of the tracker module 100C according to the present exemplary aspect and, specifically, represents the cross section taken along the XII-XII line in FIG. 11.

As illustrated in FIG. 11, the tracker module 100C according to the present exemplary aspect differs from the tracker module 100A according to the first exemplary aspect in provision of integrated circuits 80C and 80D, instead of the integrated circuit 80.

Each of the integrated circuits 80C and 80D is a semiconductor IC and is composed, for example, using the CMOS. Specifically, each of the integrated circuits 80C and 80D is manufactured using an Si substrate or an SOI substrate. Alternatively, the integrated circuits 80C and 80D may be made of at least one of GaAs, SiGe, and GaN. The semiconductor material of the integrated circuits 80C and 80D is not limited to the above materials.

The integrated circuit 80C is an example of the second integrated circuit. The integrated circuit 80C includes the PR switch portion 10A.

The integrated circuit 80D is an example of the first integrated circuit. The integrated circuit 80D includes the SC switch portion 20A, the OS switch portion 30A, and the multiple bump electrodes 81.

As described above, in the present example, the PR switch portion 10A, the SC switch portion 20A, and the OS switch portion 30A are dispersedly arranged in the multiple integrated circuits, as in the second exemplary aspect. The signal lines with which the integrated circuit 80C is connected to the integrated circuit 80D are arranged in the module laminate 90, although not illustrated in FIG. 11 and FIG. 12.

Figure 12:
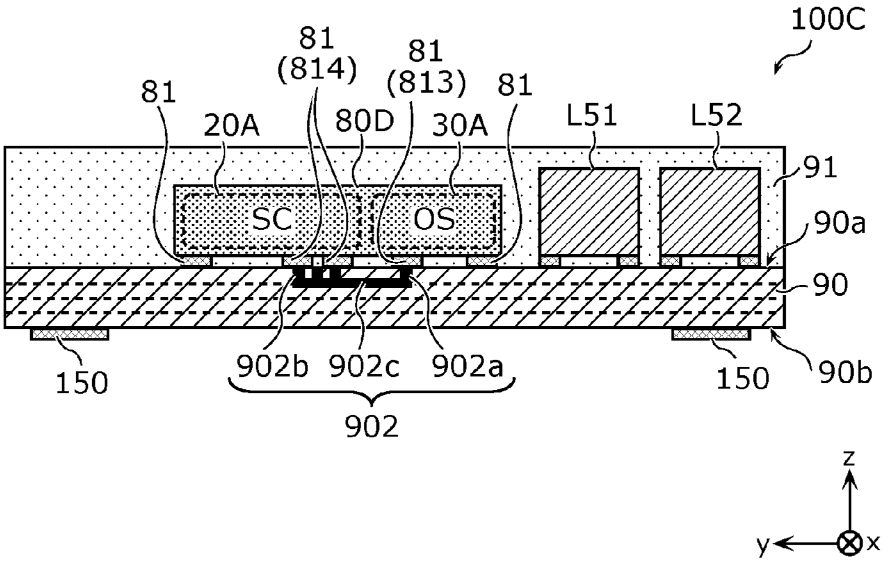
FIG. 12 is a cross-sectional view of the tracker module according to the third exemplary aspect.

In the present example, as illustrated in FIG. 11 and FIG. 12, the signal lines 902 with which the SC switch portion 20A is connected to the OS switch portion 30A included in the integrated circuit 80D are provided in the module laminate 90. The specific configuration of the signal lines 902 is the same as that in the first exemplary aspect.

Each of one or multiple signal lines 902 is any of the signal lines 61 to 64 illustrated in FIG. 7. Also, in the tracker module 100C according to the present exemplary aspect, the efficiency and the heat dissipation can be improved as in the first exemplary aspect.

3.4 Fourth Exemplary Aspect

Next, a tracker module 100D according to a fourth exemplary aspect will be described with reference to FIG. 13 to FIG. 14. The following description focuses on points different from the first exemplary aspect and description of points common to the first exemplary aspect is omitted or simplified.

Figure 13:
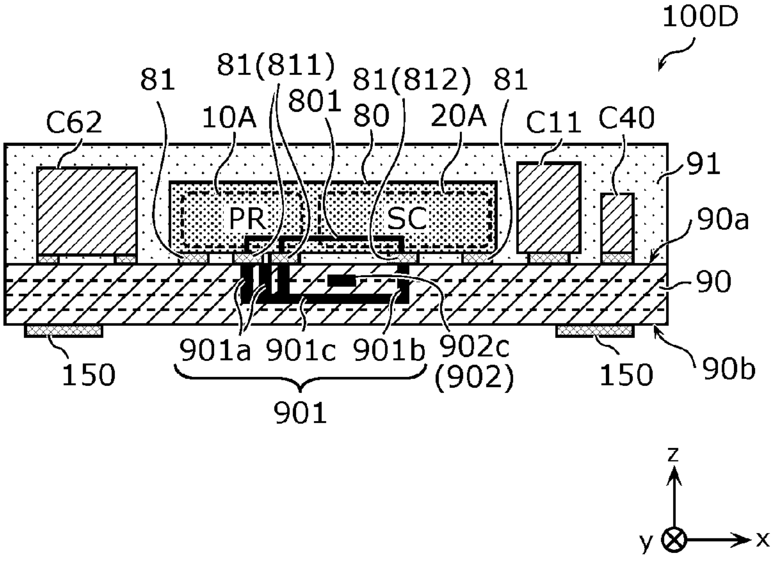
FIG. 13 is a cross-sectional view of a tracker module according to a fourth exemplary aspect.

FIG. 13 is a cross-sectional view of the tracker module 100D according to the present exemplary aspect. The plan view of the tracker module 100D according to the present exemplary aspect is the same as the plan view of the tracker module 100A illustrated in FIG. 4. FIG. 13 represents the cross section taken along the V-V line in FIG. 4.

In the tracker module 100D, the integrated circuit 80 includes a signal line 801. The signal line 801 is provided in, for example, the wiring layer, the redistribution layer, or the like of a semiconductor substrate of the integrated circuit 80.

The signal line 801 is an example of a third signal line. The bump electrodes 811 are connected to the bump electrode 812 with the signal line 801. In other words, the signal line 801 is a signal line that supplies the first voltage generated in the pre-regulator circuit 10 to the switched-capacitor circuit 20, like the signal line 901 provided in the module laminate 90.

The signal line 801 and the signal line 901 are connected to the same bump electrodes 81. In other words, the signal line 801 and the signal line 901 are signal lines that transmit the same voltage signal. Specifically, the signal line 801 and the signal line 901 are one of the signal lines 51 to 54 illustrated in FIG. 7. For example, the signal line 51 is composed of the two signal lines 801 and 901.

Figure 14:
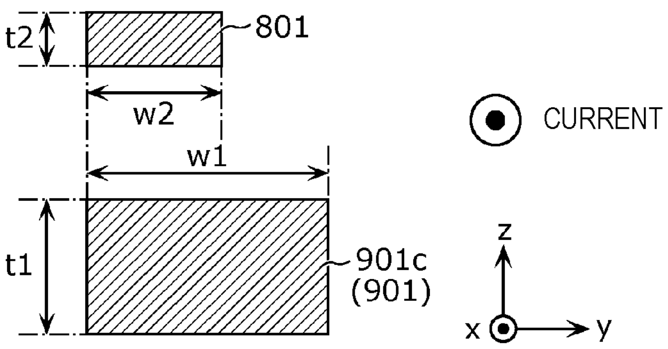
FIG. 14 is a cross-sectional view illustrating a signal line in an integrated circuit and a signal line in a module laminate according to the fourth exemplary aspect.

FIG. 14 is a cross-sectional view illustrating the signal line 801 in the integrated circuit 80 and the signal line 901 in the module laminate 90 according to the present exemplary aspect. The cross sections of both of the signal lines 801 and 901 represent cross sections orthogonal to the direction in which the current flows. In an exemplary aspect where each signal line includes the via conductors and the lines (extending in the direction parallel to the main surfaces of the substrate), the cross section of the signal line is the cross section not of the via conductors but of the line portions extending in the direction parallel to the main surfaces of the substrate.

For example, the cross section illustrated in FIG. 14 is the cross section orthogonal to the direction in which each of the signal lines 801 and 901 extends and, specifically, is the cross section parallel to the yz plane. The thickness of the signal line 901 (the wiring layer 901*c*) is denoted by t1 and the width thereof is denoted by w1. The thickness of the signal line 801 is denoted by t2 and the width thereof is denoted by w2.

The cross-sectional area w1×t1 of the signal line 901 is greater than the cross-sectional area w2×t2 of the signal line 801. Accordingly, as described in the first exemplary aspect, the use of the signal line 901 for the transmission of the voltage signal enables the efficiency and the heat dissipation of the tracker module 100D to be improved.

In addition, in the present exemplary aspect, the signal line 801 having a smaller cross-sectional area is also used for the transmission of the same voltage signal as the voltage signal transmitted through the signal line 901. In other words, the cross-sectional area of the signal lines through which the voltage signal is transmitted is the cross-sectional area resulting from addition of the cross-sectional area w2×t2 of the signal line 801 to the cross-sectional area w1×t1 of the signal line 901. Accordingly, the efficiency can be improved as compared with a case in which the single signal line 901 is provided.

Although the thickness t1 of the signal line 901 is greater than the thickness t2 of the signal line 801 in the present exemplary aspect, the thickness t1 and the thickness t2 are not limited to this. For example, the thickness t1 may be equal to the thickness t2. Although the width w1 of the signal line 901 is greater than the width w2 of the signal line 801, the width w1 and the width w2 are not limited to this. For example, the width w1 may be equal to the width w2. As long as the cross-sectional area w1×t1 of the signal line 901 is greater than the cross-sectional area w2×t2 of the signal line 801, the thickness t1 may be smaller than the thickness t2 or the width w1 may be smaller than the width w2.

Although the example is illustrated in FIG. 13 in which the signal line 801 that supplies the first voltage generated in the pre-regulator circuit 10 to the switched-capacitor circuit 20 is provided in the integrated circuit 80, the signal line 801 is not limited to this.

Figure 15:
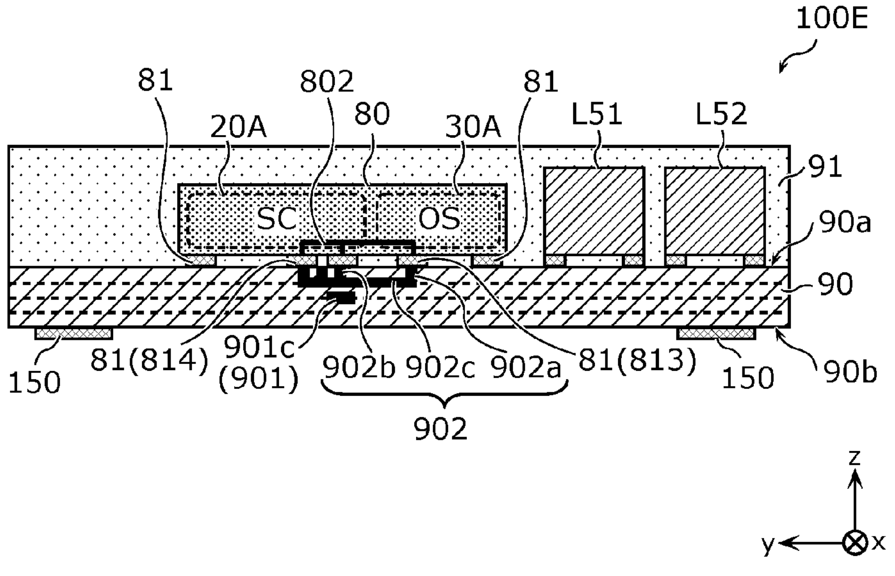
FIG. 15 is a cross-sectional view of a tracker module according to another example of the fourth exemplary aspect.

FIG. 15 is a cross-sectional view of another tracker module 100E of the present exemplary aspect. The plan view of the tracker module 100E is the same as the plan view of the tracker module 100A illustrated in FIG. 4. FIG. 15 represents the cross section taken along the VI-VI line in FIG. 4.

In the tracker module 100E, the integrated circuit 80 includes a signal line 802. The signal line 802 is provided in, for example, the wiring layer or the redistribution layer of the semiconductor substrate of the integrated circuit 80.

The signal line 802 is an example of a fourth signal line. The bump electrodes 814 are connected to the bump electrode 813 with the signal line 802. In other words, the signal line 802 is a signal line that supplies one of the multiple second voltages generated in the switched-capacitor circuit 20 to the supply modulator 30, like the signal line 902 provided in the module laminate 90.

The signal line 802 and the signal line 902 are connected to the same bump electrodes 81. In other words, the signal line 802 and the signal line 902 are signal lines that transmit the same voltage signal. Specifically, the signal line 802 and the signal line 902 are one of the signal lines 61 to 64 illustrated in FIG. 7. For example, the signal line 61 is composed of the two signal lines 802 and 902.

Also, in the tracker module 100E illustrated in FIG. 15, the efficiency can be improved as in the tracker module 100D.

As described above, further high efficiency of the tracker modules 100D and 100E is expected by providing the signal lines in both the module laminate 90 and the integrated circuit 80. For example, realizing all the signal lines 51 to 54 and 61 to 64 by the signal lines provided in the module laminate 90 and the signal lines provided in the integrated circuit 80 enables the efficiency and the heat dissipation to be sufficiently improved.

In contrast, due to the size of the integrated circuit 80, it may be possible not to provide the eight signal lines. In other words, when the number of the signal lines to be provided in the integrated circuit 80 is limited, priority is given to the signal lines through which the voltage signals of high voltage values are transmitted. With this configuration, the loss of the signal lines of high voltages can be suppressed to improve the efficiency.

The specific priority order is the same as that in the signal lines 901 and 902 provided in the module laminate 90. For example, priority is given to the signal lines through which the voltage signals of high voltage values are transmitted, among the signal lines 51 to 54 and 61 to 64. Alternatively, priority may be given to the signal lines 51 to 54 with which the pre-regulator circuit 10 is connected to the switched-capacitor circuit 20. With this configuration, the loss of the signal lines of high voltages can be suppressed to improve the efficiency.

3.5 Fifth Exemplary Aspect

Next, a tracker module 100F according to a fifth exemplary aspect will be described with reference to FIG. 16. It is noted that the following description focuses on points different from the first exemplary aspect and description of points common to the first exemplary aspect is omitted or simplified.

Figure 16:
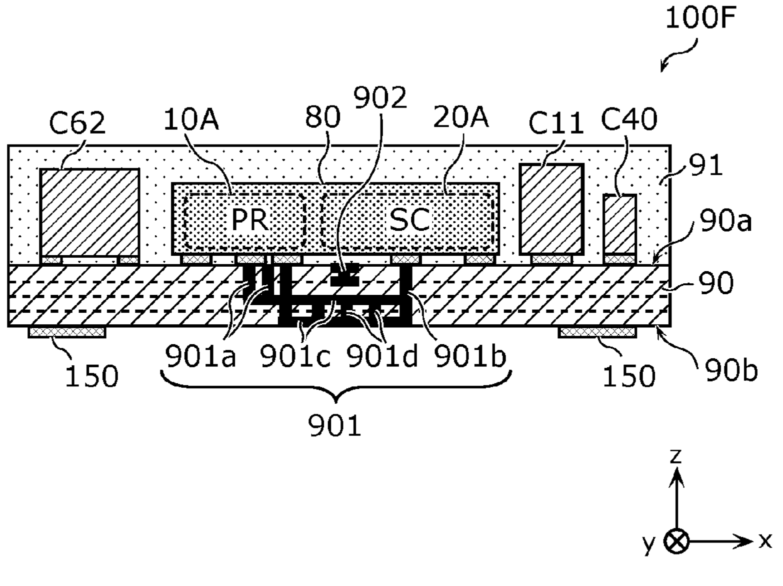
FIG. 16 is a cross-sectional view of a tracker module according to a fifth exemplary aspect.

FIG. 16 is a cross-sectional view of the tracker module 100F according to the present exemplary aspect. The plan view of the tracker module 100F according to the present exemplary aspect is the same as the plan view of the tracker module 100A illustrated in FIG. 4. FIG. 16 represents the cross section taken along the V-V line in FIG. 4.

As illustrated in FIG. 16, the signal line 901 includes multiple via conductors 901*a*, 901*b*, and 901*d* and multiple wiring layers 901*c*. The via conductors 901*a* and 901*b*are the same as those in the first exemplary aspect.

In the present example, the multiple wiring layers 901*c* are provided in different layers in the module laminate 90 or on the surface of the module laminate 90. In other words, the signal line 901 is multi-layered. For example, in the example illustrated in FIG. 16, the two wiring layers 901*c* are provided in the module laminate 90 and on the main surface 90*b* of the module laminate 90.

The multiple wiring layers 901*c* are connected with the via conductors 901*d*. Accordingly, the volume of the signal line 901 with which the bump electrodes 811 are connected to the bump electrode 812 is increased to increase the cross-sectional area of the cross section orthogonal to the direction in which the current flows. Consequently, the loss at the signal line 901 can be reduced to improve the efficiency of the tracker module 100F.

Although the example is described in the present example in which the signal line 901 is multi-layered, the signal line 902 with which the switched-capacitor circuit 20 is connected to the supply modulator 30 maybe multi-layered. In addition, the signal line 801 or 802 provided in the integrated circuit 80 maybe multi-layered.

It is noted that priority may be given to the signal lines through which the voltage signals of high voltage values are transmitted as the signal lines to be multi-layered. With this configuration, the loss of the signal lines of high voltages can be suppressed to improve the efficiency. Alternatively, priority may be given to the signal lines 51 to 54 with which the pre-regulator circuit 10 is connected to the switched-capacitor circuit 20. With this configuration, the loss of the signal lines of high voltages can be suppressed to improve the efficiency.

4. Technical Effects

As described above, the tracker module according to exemplary aspects of the present embodiment includes the module laminate 90 and at least one integrated circuit that is arranged on the module laminate 90 and that includes the integrated circuit 80 or 80A. The integrated circuit 80 or 80A includes the switch included in the pre-regulator circuit 10 configured to convert the input voltage into the first voltage, at least one switch included in the switched-capacitor circuit 20 configured to generate the plurality of discrete voltages based on the first voltage, the bump electrode 811 connected to the switch included in the pre-regulator circuit 10, and the bump electrode 812 connected to one of the at least one switch included in the switched-capacitor circuit 20. The at least one integrated circuit includes the switch included in the supply modulator 30 configured to selectively output at least one of the discrete voltages generated by the switched-capacitor circuit 20. The module laminate 90 includes the signal line 901 with which the bump electrode 811 is connected to the bump electrode 812.

With the above configuration, degradation of characteristics of the tracker module can be suppressed. As a result, the efficiency of the tracker module can be improved.

Specifically, since the module laminate 90 is generally greater than the integrated circuit 80 or 80A, the signal line 901 provided in the module laminate 90 has a higher degree of freedom in shape and/or layout, compared with the line provided in the integrated circuit 80 or 80A. Accordingly, it is easy to increase the width and the thickness of the signal line 901 to reduce the resistance thereof. Consequently, the provision of the signal line 901 in the module laminate 90 enables loss caused by the signal line to be reduced to realize the highly efficient tracker module.

The integrated circuit 80 or 80A is thermally connected to the module laminate 90 via the bump electrodes 81 and the signal line 901. For example, the bump electrodes 81 and the signal line 901 can be formed of a material, such as metal, which has high thermal conductivity. Accordingly, since it is possible to efficiently transmit heat generated in the integrated circuit 80 or 80A to the module laminate 90, the heat dissipation of the integrated circuit 80 or 80A can be improved. The improvement of the heat dissipation suppresses the influence of the heat to the circuit elements included in the integrated circuit 80 or 80A to realize the highly efficient tracker module.

For example, the signal line with which the pre-regulator circuit 10 is connected to the switched-capacitor circuit 20 has a high frequency of transmission of the voltage signal in order to keep the voltages V1 to V4 at the nodes N1 to N4, respectively, in the switched-capacitor circuit 20. Providing the signal line having a high frequency as the signal line 901 in the module laminate 90 improves the efficiency of the tracker module.

For example, the switch included in the supply modulator 30 is included in the integrated circuit 80. The integrated circuit 80 includes the bump electrode 813 connected to the switch included in the supply modulator 30 and the bump electrode 814 connected to one of the at least one switch included in the switched-capacitor circuit 20. The module laminate 90 includes the signal line 902 with which the bump electrode 813 is connected to the bump electrode 814.

With the above configuration, since the signal line with which the switched-capacitor circuit 20 is connected to the supply modulator 30 is also provided in the module laminate 90, the efficiency and the heat dissipation can be improved.

For example, the tracker module according to the present embodiment may include the integrated circuit 80B arranged on the module laminate 90, like the tracker module 100B. The integrated circuit 80B includes the switch included in the supply modulator 30.

Also, when the multiple integrated circuits 80A and 80B are provided in the above manner, the efficiency and the heat dissipation of the tracker module can be improved.

Another tracker module according to the present embodiment includes the module laminate 90 and the integrated circuit 80 or 80D arranged on the module laminate 90. The integrated circuit 80 or 80D includes at least one switch included in the switched-capacitor circuit 20 configured to generate the plurality of discrete voltages based on the first voltage, the switch included in the supply modulator 30 configured to selectively output at least one of the multiple discrete voltages generated by the switched-capacitor circuit 20, the bump electrode 814 connected to one of the at least one switch included in the switched-capacitor circuit 20, and the bump electrode 813 connected to the switch included in the supply modulator 30. The module laminate 90 includes the signal line 902 with which the bump electrode 814 is connected to the bump electrode 813.

With the above configuration, the degradation of the characteristics of the tracker module can be suppressed. For example, the efficiency of the tracker module can be improved.

Specifically, the provision of the signal line 902 in the module laminate 90 enables the loss caused by the signal line to be reduced to realize the highly efficient tracker module. In addition, since it is possible to efficiently transmit the heat generated in the integrated circuit 80 or 80D to the module laminate 90 using the bump electrodes 81 and the signal line 902, it is also possible to improve the heat dissipation of the integrated circuit 80 or 80D. The improvement of the heat dissipation suppresses the influence of the heat to the circuit elements included in the integrated circuit 80 or 80D to realize the highly efficient tracker module.

For example, the integrated circuit 80 includes the switch included in the pre-regulator circuit 10 configured to convert the input voltage into the first voltage, the bump electrode 811 connected to the switch included in the pre-regulator circuit 10, and the bump electrode 812 connected to one of the at least one switch included in the switched-capacitor circuit 20. The module laminate 90 include the signal line 901 with which the bump electrode 811 is connected to the bump electrode 812.

With this configuration, since the signal line with which the pre-regulator circuit 10 is connected to the switched-capacitor circuit 20 is also provided in the module laminate 90, the efficiency and the heat dissipation can be improved.

For example, the tracker module according to the present embodiment may include the integrated circuit 80C arranged on the module laminate 90, like the tracker module 100C. The integrated circuit 80C includes the switch included in the pre-regulator circuit 10 configured to convert the input voltage into the first voltage.

With this configuration, also in the case in which the multiple integrated circuits 80C and 80D are provided, the efficiency and the heat dissipation of the tracker module can be improved.

For example, in the tracker module according to the present embodiment, the supply modulator 30 is configured to control the output voltage based on the digital control signal corresponding to the envelope signal of the radio-frequency signal.

With this configuration, the digital ET mode can be applied to the power amplifier 2 to suppress degradation of the output waveform of the power supply voltage $V_{ET}$.

For example, the signal line 901 is a signal line through which the voltage signal of a voltage value higher than that of the voltage signal transmitted through at least one signal line, among the multiple signal lines 51 to 54 with which the pre-regulator circuit 10 is connected to the switched-capacitor circuit 20, is transmitted.

With this configuration, loss caused by the signal line of high voltage can be suppressed to improve the efficiency.

For example, the signal line 901 may be the signal line 51 through which the voltage signal of the highest voltage value is transmitted, among the multiple signal lines 51 to 54 with which the pre-regulator circuit 10 is connected to the switched-capacitor circuit 20.

With this configuration, the efficiency of the tracker module can be further improved.

For example, in the tracker module according to the present embodiment, the integrated circuit 80 mayinclude the signal line 801 with which the bump electrodes 811 are connected to the bump electrode 812, like the tracker module 100D or 100E.

With this configuration, the provision of the signal lines 901 and 801 in both the module laminate 90 and the integrated circuit 80 enables the loss caused by the signal line to be further suppressed to further improve the efficiency.

For example, the signal line 801 is part of a signal line through which the voltage signal of a voltage value higher than that of the voltage signal transmitted through at least one signal line, among the multiple signal lines 51 to 54 with which the pre-regulator circuit 10 is connected to the switched-capacitor circuit 20, is transmitted.

With this configuration, the loss caused by the signal line of high voltage can be suppressed to improve the efficiency.

For example, the cross-sectional area of the cross section orthogonal to the extending direction of the signal line 901 is greater than the cross-sectional area of the cross section orthogonal the extending direction of the signal line 801.

With this configuration, since the low resistance of the signal line 901 is realized, the efficiency can further be improved.

For example, the signal line 901 may include the multiple wiring layers 901*c*arranged on the surface of the module laminate 90 or in the module laminate 90 and the via conductors 901*d* with which the multiple wiring layers 901*c* are connected.

With this configuration, since the low resistance of the signal line 901 is realized, the efficiency can further be improved.

For example, the integrated circuit 80, 80A, or 80D may include at least one of the multiple bump electrodes 811 and the multiple bump electrodes 812.

With this configuration, since the contact area of the integrated circuit 80 and the module laminate 90 is increased, the low resistance of the connection resistor is realized. In addition, it is possible to improve the heat dissipation.

For example, the signal line 902 is a signal line through which the voltage signal of a voltage value higher than that of the voltage signal transmitted through at least one signal line, among the multiple signal lines 61 to 64 with which the switched-capacitor circuit 20 is connected to the supply modulator 30, is transmitted.

With this configuration, the loss caused by the signal line of high voltage can be suppressed to improve the efficiency.

For example, the signal line 902 may be the signal line 61 through which the voltage signal of the highest voltage value is transmitted, among the multiple signal lines 61 to 64 with which the switched-capacitor circuit 20 is connected to the supply modulator 30.

With this configuration, the efficiency of the tracker module can be further improved.

For example, the integrated circuit 80 mayinclude the signal line 802 with which the bump electrode 813 is connected to the bump electrode 814.

With this configuration, the provision of the signal lines 902 and 802 in both the module laminate 90 and the integrated circuit 80 enables the loss caused by the signal line to be further suppressed to further improve the efficiency.

For example, the signal line 802 is part of a signal line through which the voltage signal of a voltage value higher than that of the voltage signal transmitted through at least one signal line, among the multiple signal lines 61 to 64 with which the switched-capacitor circuit 20 is connected to the supply modulator 30, is transmitted.

With this configuration, the loss caused by the signal line of high voltage can be suppressed to improve the efficiency.

The tracker module according to the present embodiment includes the module laminate 90 and at least one integrated circuit that is arranged on the module laminate 90 and that includes the integrated circuit 80 or 80A. The integrated circuit 80 or 80A includes at least one switch included in the first circuit, at least one switch included in the third circuit, the bump electrode 811 connected to one of the at least one switch included in the third circuit, and the bump electrode 812 connected to one of the at least one switch included in the first circuit. The at least one integrated circuit includes at least one switch included in the second circuit. The first circuit includes the capacitor C12 having the first electrode and the second electrode and the capacitor C15 having the third electrode and the fourth electrode. The at least one switch included in the first circuit includes the switches S21 to S24 and S31 to S34. A first end of the switch S21 and a first end of the switch S22 are connected to the first electrode. A first end of the switch S32 and a first end of the switch S31 are connected to the second electrode. A first end of the switch S23 and a first end of the switch S24 are connected to the third electrode. A first end of the switch S34 and a first end of the switch S33 are connected to the fourth electrode. The second end of the switch S21, the second end of the switch S32, the second end of the switch S23, and the second end of the switch S34 are connected to each other. The other end of the switch S22 is connected to the other end of the switch S24. The second end of the switch S31 is connected to the second end of the switch S33. The second circuit includes the output terminal 130. The at least one switch included in the second switch includes the switch S53 connected between the second end of the switch S21, the second end of the switch S32, the second end of the switch S23, and the second end of the switch S34, and the output terminal 130, and the switch S52 connected between the second end of the switch S22 and the second end of the switch S24, and the output terminal 130. The third circuit includes the input terminal 110. The at least one switch included in the third circuit includes the switch S71 connected between the input terminal 110 and a first end of the power inductor L71, the switch S72 connected between the first end of the power inductor L71 and the ground, and the switch S63 connected between the second end of the power inductor L71, and the second end of the switch S21, the second end of the switch S32, the second end of the switch S23, and the second end of the switch S34. The module laminate 90 includes the signal line 901 with which bump electrode 811 is connected to the bump electrode 812.

With this configuration, the degradation of the characteristics of the tracker module can be suppressed. As a result, the efficiency of the tracker module can be improved.

In an exemplary aspect, the provision of the signal line 901 in the module laminate 90 enables the loss caused by the signal line to be reduced to realize the highly efficient tracker module. In addition, since it is possible to efficiently transmit the heat generated in the integrated circuit 80 to the module laminate 90 using the bump electrodes 81 and the signal line 901, it is also possible to improve the heat dissipation of the integrated circuit 80. The improvement of the heat dissipation suppresses the influence of the heat to the circuit elements included in the integrated circuit 80 to realize the highly efficient tracker module.

The communication device 7 according to the present embodiment includes the signal processing circuit (RFIC) 5 that processes the radio-frequency signal, the power amplifier 2 that transmits the radio-frequency signal between the signal processing circuit and the antenna 6, and the tracker module that supplies the power supply voltage to the power amplifier 2.

With this configuration, it is possible to achieve the same technical advantages as those of the tracker modules described above.

It is noted that although the tracker modules and the communication devices according to the present disclosure are described based on the above embodiments and so on, the present disclosure is not limited to the above embodiments.

For example, in the circuit configurations of the tracker modules and the communication devices according to the above embodiments, other circuit elements, lines, and so on may be provided between the paths with which the respective circuit elements and signal lines disclosed in the drawings are connected as would be appreciated to one skilled in the art.

REFERENCE SIGNS LIST

1 power supply circuit
2 power amplifier
3 filter
4 PA control circuit
5 RFIC
6 antenna
7 communication device
10 pre-regulator circuit
10A PR switch portion
20 switched-capacitor circuit
20A SC switch portion
30 supply modulator
30A OS switch portion
40 filter circuit
50 direct current power source
51, 52, 53, 54, 61, 62, 63, 64, 801, 802, 901, 902 signal line
80, 80A, 80B, 80C, 80D integrated circuit
81, 811, 812, 813, 814 bump electrode
90 module laminate
90*a*, 90*b* main surface
91 resin member
100A, 100B, 100C, 100D, 100E, 100F tracker module
110, 131, 132, 133, 134, 140 input terminal
111, 112, 113, 114, 130, 141 output terminal
115, 116 inductor connection terminal
117, 120, 135, 136 control terminal
150 land electrode
901*c*, 902*c* wiring layer
901*a*, 901*b*, 901*d*, 902*a*, 902*b* via conductor
C10, C11, C12, C13, C14, C15, C16, C20, C30, C40, C51, C52, C61, C62, C63, C64 capacitor
L51, L52, L53 inductor
L71 power inductor
N1, N2, N3, N4 node
R51 resistor
S11, S12, S13, S14, S21, S22, S23, S24, S31, S32, S33, S34, S41, S42, S43, S44, S51, S52, S53, S54, S61, S62, S63, S71, S72 switch
V1, V2, V3, V4 voltage

What is claimed:

1. A tracker module comprising:
a module laminate; and
at least one integrated circuit disposed on the module laminate and that includes a first integrated circuit including:
a switch included in a pre-regulator circuit that is configured to convert input voltage into a first voltage,
at least one switch included in a switched-capacitor circuit that is configured to generate a plurality of discrete voltages based on the first voltage,
a first IC terminal connected to the switch included in the pre-regulator circuit, and
a second IC terminal connected to the at least one switch included in the switched-capacitor circuit,
wherein the at least one integrated circuit further includes a switch included in a supply modulator that is configured to selectively output at least one of the plurality of discrete voltages generated by the switched-capacitor circuit, and
wherein the module laminate includes a first signal line that connects the first IC terminal to the second IC terminal.

2. The tracker module according to claim 1, wherein the first integrated circuit includes:
the switch included in the supply modulator,
a third IC terminal connected to the switch included in the supply modulator, and
a fourth IC terminal connected to the at least one switch included in the switched-capacitor circuit, and
wherein the module laminate includes a second signal line that connects the third IC terminal to the fourth IC terminal.

3. The tracker module according to claim 2, wherein the second signal line is a signal line through which a voltage signal is transmitted that has a voltage value higher than that of a voltage signal transmitted through at least one signal line of a plurality of signal lines with which the switched-capacitor circuit is connected to the supply modulator.

4. The tracker module according to claim 3, wherein the second signal line is a signal line of the plurality of signal lines through which a voltage signal of a highest voltage value is transmitted.

5. The tracker module according to claim 2, wherein the first integrated circuit includes a fourth signal line that connects the third IC terminal to the fourth IC terminal.

6. The tracker module according to claim 5, wherein the fourth signal line is part of a signal line through which a voltage signal is transmitted that has a voltage value higher than that of a voltage signal transmitted through at least one signal line of a plurality of signal lines with which the switched-capacitor circuit is connected to the supply modulator.

7. The tracker module according to claim 1, further comprising a second integrated circuit disposed on the module laminate and that includes the switch included in the supply modulator.

8. The tracker module according to claim 1, wherein the supply modulator is configured to control an output voltage based on a digital control signal that corresponds to an envelope signal of a radio-frequency signal.

9. The tracker module according to claim 1, wherein the first signal line is a signal line through which a voltage signal is transmitted that has a voltage value higher than that of a voltage signal transmitted through at least one signal line of a plurality of signal lines with which the pre-regulator circuit is connected to the switched-capacitor circuit.

10. The tracker module according to claim 9, wherein the first signal line is a signal line of the plurality of signal lines through which a voltage signal of a highest voltage value is transmitted.

11. The tracker module according to claim 1, wherein the first integrated circuit includes a third signal line that connects the first IC terminal to the second IC terminal.

12. The tracker module according to claim 11, wherein the third signal line is part of a signal line through which a voltage signal is transmitted that has a voltage value higher than that of a voltage signal transmitted through at least one signal line of a plurality of signal lines with which the pre-regulator circuit is connected to the switched-capacitor circuit.

13. The tracker module according to claim 11, wherein a cross-sectional area of a cross section orthogonal to an extending direction of the first signal line is greater than a cross-sectional area of a cross section orthogonal to an extending direction of the third signal line.

14. The tracker module according to claim 1, wherein the first signal line includes a plurality of wiring layers arranged on a surface of the module laminate or in the module laminate, and at least one via conductor that connects the plurality of wiring layers.

15. The tracker module according to claim 1, wherein the first integrated circuit includes at least one of a plurality the first IC terminals and a plurality of the second IC terminals.

16. A communication device comprising:
- a signal processing circuit configured to process a radio-frequency signal;
- a power amplifier circuit configured to transmit the radio-frequency signal between the signal processing circuit and an antenna; and
- the tracker module according to claim 1 that is configured to supply a power supply voltage to the power amplifier circuit.

17. A tracker module comprising:
- a module laminate; and
- a first integrated circuit disposed on the module laminate and that includes:
  - at least one switch included in a switched-capacitor circuit that is configured to generate a plurality of discrete voltages based on first voltage,
  - a switch included in a supply modulator that is configured to selectively output at least one of the plurality of discrete voltages generated by the switched-capacitor circuit,
  - a first IC terminal connected to the switch included in the supply modulator, and
  - a second IC terminal connected to the at least one switch included in the switched-capacitor circuit,
- wherein the module laminate includes a first signal line that connects the first IC terminal to the second IC terminal.

18. The tracker module according to claim 17, wherein the first integrated circuit includes:
- a switch included in a pre-regulator circuit that is configured to convert an input voltage into the first voltage,
- a third IC terminal connected to the switch included in the pre-regulator circuit, and
- a fourth IC terminal connected to the at least one switch included in the switched-capacitor circuit, and
- wherein the module laminate includes a second signal line that connects the third IC terminal to the fourth IC terminal.

19. The tracker module according to claim 17, further comprising a second integrated circuit arranged on the module laminate and that includes a switch included in a pre-regulator circuit that is configured to convert an input voltage into the first voltage.

20. A tracker module comprising:
- a module laminate; and
- at least one integrated circuit that is disposed on the module laminate and that includes a first integrated circuit that includes:
  - at least one switch included in a first circuit,
  - at least one switch included in a third circuit,
  - a first IC terminal connected to the at least one switch included in the third circuit, and
  - a second IC terminal connected to the at least one switch included in the first circuit,
- wherein the at least one integrated circuit includes at least one switch included in a second circuit,
- wherein the first circuit includes:
  - a first capacitor having a first electrode and a second electrode, and
  - a second capacitor having a third electrode and a fourth electrode,
- wherein the at least one switch included in the first circuit includes a first switch, a second switch, a third switch, a fourth switch, a fifth switch, a sixth switch, a seventh switch, and an eighth switch,
- wherein:
  - a first end of the first switch and a first end of the third switch are connected to the first electrode,
  - a first end of the second switch and a first end of the fourth switch are connected to the second electrode,
  - a first end of the fifth switch and a first end of the seventh switch are connected to the third electrode,
  - a first end of the sixth switch and a first end of the eighth switch are connected to the fourth electrode,
  - a second end of the first switch, a second end of the second switch, a second end of the fifth switch, and a second end of the sixth switch are connected to each other,
  - a second end of the third switch is connected to a second end of the seventh switch,
  - a second end of the fourth switch is connected to a second end of the eighth switch,
- wherein the second circuit includes an output terminal,
- wherein the at least one switch included in the second switch includes:
  - a ninth switch connected between a second end of the first switch, a second end of the second switch, a second end of the fifth switch, and a second end of the sixth switch, and the output terminal, and a tenth switch connected between a second end of the third switch and a second end of the seventh switch, and the output terminal, wherein the third circuit includes an input terminal, wherein the at least one switch included in the third circuit includes:

an eleventh switch connected between the input terminal and a first end of a power inductor, a twelfth switch connected between the first end of the power inductor and a ground, and a thirteenth switch connected between a second end of the power inductor and the respective second ends of the first switch, the second switch, the fifth switch, and the sixth switch, and wherein the module laminate includes a first signal line that connects the first IC terminal to the second IC terminal.

* * * * *